(12) United States Patent
Guimard et al.

(10) Patent No.: US 10,181,566 B2
(45) Date of Patent: Jan. 15, 2019

(54) ELECTRICALLY CONDUCTIVE OLED CARRIER, OLED INCORPORATING SAID CARRIER, AND ITS MANUFACTURE

(71) Applicant: SAINT-GOBAIN GLASS FRANCE, Courbevoie (FR)

(72) Inventors: Denis Guimard, Paris (FR); Georges Zagdoun, La Garenne Colombes (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 316 days.

(21) Appl. No.: 14/773,145

(22) PCT Filed: Mar. 10, 2014

(86) PCT No.: PCT/FR2014/050535
§ 371 (c)(1),
(2) Date: Sep. 4, 2015

(87) PCT Pub. No.: WO2014/135817
PCT Pub. Date: Sep. 12, 2014

(65) Prior Publication Data
US 2016/0020416 A1 Jan. 21, 2016

(30) Foreign Application Priority Data
Mar. 8, 2013 (FR) ...................... 13 52131

(51) Int. Cl.
*H01L 51/52* (2006.01)
*H01L 51/00* (2006.01)

(52) U.S. Cl.
CPC ...... *H01L 51/0096* (2013.01); *H01L 51/5212* (2013.01); *H01L 51/5268* (2013.01); *H01L 51/5275* (2013.01); *H01L 2251/5361* (2013.01)

(58) Field of Classification Search
CPC ............. H01L 51/0096; H01L 51/5212; H01L 51/5215; H01L 51/5209; H01L 51/5234; H01L 51/5228; H01L 51/5268
See application file for complete search history.

(56) References Cited

U.S. PATENT DOCUMENTS 6,645,645 B1 11/2003 Adachi et al.
2001/0033935 A1 10/2001 Laroche et al.
(Continued)

FOREIGN PATENT DOCUMENTS

EP 0 825 631 A2 2/1998
EP 0 888 035 A1 12/1998
(Continued)

OTHER PUBLICATIONS

Greiner, H., "Light Extraction from Organic Light Emitting Diode Substrates: Simulation and Experiment," Japanese Journal of Applied Physics, vol. 46, No. 7A, pp. 4125-4137 (2007).
(Continued)

*Primary Examiner* — Phuc Dang
(74) *Attorney, Agent, or Firm* — Pillsbury Winthrop Shaw Pittman LLP

(57) ABSTRACT

An electrically conductive OLED carrier includes in this order a glazing substrate; an electrode arranged in a metal grid made up of strands; an electrically insulating light extraction layer under the metal grid; and a layer partially structured in its thickness. The layer of refractive is of index n3 of 1.7 to 2.3, and is located on the light extraction layer. The partially structured layer is formed from a region structured with cavities at least partially containing the metal grid; and from another region, called the low region, located on the light extraction layer. The separation H between the surface of the structured region called the high surface, and therefore that furthest from the substrate, and the surface of the metal grid called the upper surface, and therefore that
(Continued)

furthest from the substrate is, in absolute value, smaller than or equal to 100 nm.

28 Claims, 13 Drawing Sheets

(56) References Cited

U.S. PATENT DOCUMENTS

| | | |
|---|---|---|
| 2005/0285509 A1 | 12/2005 | Funamoto et al. |
| 2011/0001159 A1 | 1/2011 | Nakamura et al. |
| 2011/0001420 A1* | 1/2011 | Tchakarov .......... H01L 51/5212 313/355 |
| 2012/0155093 A1 | 6/2012 | Yamada et al. |
| 2013/0056778 A1 | 3/2013 | Sano et al. |
| 2014/0021450 A1* | 1/2014 | Young .................... B82Y 20/00 257/40 |

FOREIGN PATENT DOCUMENTS

| | | |
|---|---|---|
| EP | 1 406 474 A1 | 4/2004 |
| EP | 1 763 081 A2 | 3/2007 |
| EP | 2 178 343 A1 | 4/2010 |
| EP | 2 278 852 A1 | 1/2011 |
| JP | H07-005450 A | 1/1995 |
| JP | H07-316826 A | 12/1995 |
| JP | H10-092327 A | 4/1998 |
| JP | 2000-284724 A | 10/2000 |
| JP | 2004-111095 A | 4/2004 |
| JP | 2005-239789 A | 9/2005 |
| JP | 2005-276803 A | 10/2005 |
| JP | 2007-080579 A | 3/2007 |
| JP | 2008-277202 A | 11/2008 |
| JP | 2010-103120 A | 5/2010 |
| JP | 2012-079419 A | 4/2012 |
| RU | 2 470 415 C2 | 12/2012 |
| WO | WO 97/034447 A1 | 9/1997 |
| WO | WO 02/37568 A1 | 5/2002 |
| WO | WO 2004/025334 A2 | 3/2004 |
| WO | WO 2008/139934 A1 | 11/2008 |
| WO | WO 2009/071822 A2 | 6/2009 |
| WO | WO 2010/084922 A1 | 7/2010 |
| WO | WO 2010/084925 A1 | 7/2010 |
| WO | WO 2010/112786 A2 | 10/2010 |
| WO | WO 2011/089343 A1 | 7/2011 |
| WO | WO 2011/096244 A1 | 8/2011 |
| WO | WO 2012/118375 A1 | 9/2012 |

OTHER PUBLICATIONS

Koura, N., "Chapter 17: Electroless Plating of Silver," *Electroless Plating—Fundamentals and Applications*, William Andrew Publishing/Noyes (1990).

International Search Report as issued in International Patent Application No. PCT/FR2014/050535, dated May 8, 2014.

Decision to Grant and Search Report as issued in Russian Patent Application No. 2015142817, dated Jan. 9, 2018.

Office Action as issued in Japanese Patent Application No. 2015-560755, dated Oct. 3, 2017.

* cited by examiner

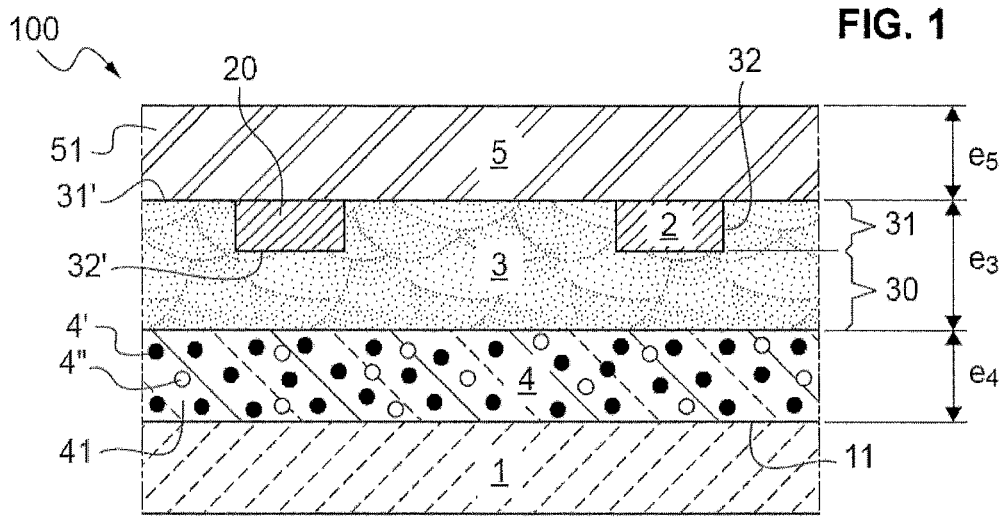
FIG. 1
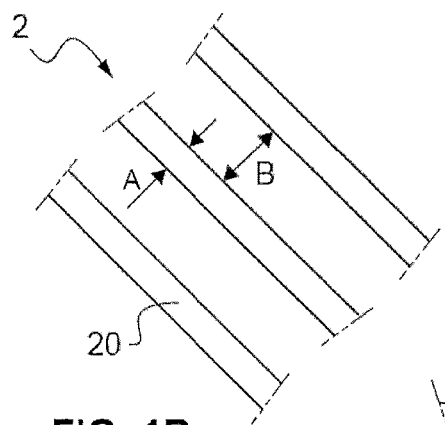
FIG. 1A
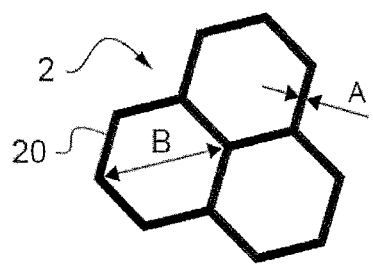
FIG. 1B
FIG. 1C
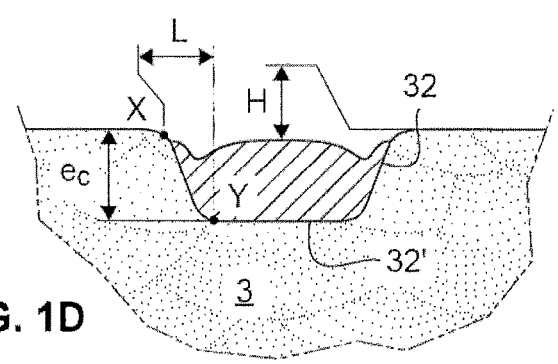
FIG. 1D

ELECTRICALLY CONDUCTIVE OLED CARRIER, OLED INCORPORATING SAID CARRIER, AND ITS MANUFACTURE

The present invention relates to an electrically conductive carrier and to an organic light-emitting device incorporating said carrier and to its fabrication.

Organic light-emitting diodes (or OLEDs) conventionally comprise an organic light-emitting material or a stack of materials supplied with an electrical power via two flanking electrodes generally taking the form of electrically conductive layers.

Conventionally, the upper electrode is a reflective metal layer, for example made of aluminium, and the lower electrode is a transparent layer based on indium oxide, generally tin-doped indium oxide (better known as ITO), of about 100 to 150 nm in thickness. However, in order to uniformly illuminate large areas it is necessary to form a discontinuous lower electrode, which is typically done by forming electrode zones of a few mm$^2$ in size and by drastically decreasing the distance between each electrode zone, typically to about ten microns.

Patent application WO 2009/071822 describes an alternative lower electrode. More precisely, the lower electrode above all comprises a conductor made up of a 1 μm-thick aperiodic grid formed from irregular silver-based strands of an average width A of about 3 μm, these strands being spaced apart by an average distance B of about 30 μm, leading to a B/A ratio of 10.

This electrically conductive grid is manufactured by evaporating silver through a mask containing a self-organized network of apertures. The mask is then removed.

In this way, via a judicious choice of B/A and of the thickness, a sheet resistance of approximately 0.6 ohm/square is obtained for this grid, particularly low. The light transmission $T_L$ of this grid is about 70% and the strands are invisible to the naked eye.

In the embodiment described with reference to FIG. 3, a filling layer made of molten glass frit, which may have a high index, is added between the grid strands. The surface formed by the strands of the grid and the molten glass frit is smoothed by mechanical polishing, for example polishing employing alumina or cerium oxide, etc. To manufacture the electrode, glass frit is deposited between and over the grid strands in order to form an overlayer on the strands. After baking, the surface is levelled down to the level of the strands.

An electrically conductive coating covering the grid and the filling layer preserves the smoothness and allows current to be distributed. The electrically conductive coating is ITO deposited by sputtering in order to obtain a resistivity ρ1 of about $10^{-4}$ ohm·cm, with a thickness from 40 nm, or is PEDOT/PSS deposited by wet processing.

Even though this electrode further contributes to increasing the overall performance of the OLED device (luminous efficiency, illumination uniformity, etc.) this performance could still be improved.

For this purpose, the present invention relates to a conductive OLED carrier comprising in this order
- a (transparent, optionally translucent—especially if it has a textured surface) organic or mineral glass glazing substrate of refractive index $n_1$ lying in a range extending from 1.3 to 1.6, having a first main face called the first surface; and
- an electrode, which comprises a layer arranged in a grid called the metal grid, which grid is made of (a monolayer or a multilayer of pure or alloyed) metal(s) having a sheet resistance smaller than 20Ω/□, better 10Ω/□, the metal grid having a thickness e2 of at least 100 nm and preferably of at most 1500 nm, the grid being formed from strands (what could also be called tracks) having a width A smaller than or equal to 50 μm, and being separated by an inter-strand distance B smaller than or equal to 5000 μm, these strands being separated by a plurality of electrically insulating non-electrically conductive fields of refractive index higher than 1.65, the carrier comprising (on the same side as the first surface and) under the metal grid:
- an electrically insulating light extraction layer that typically extracts light via bulk and/or surface scattering of light, of given thickness $e_0$, preferably comprising (consisting of):
  the first surface of the substrate, which surface is a scattering surface (textured in order to scatter light); and/or
  an additional scattering layer (preferably directly) on the first surface of the (flat or textured) substrate, preferably (essentially) made of a mineral material containing scattering elements, for example of a material the refractive index $n_4$ of which is from 1.7 to 2.3, preferably from 1.80 to 2.10, and in particular from 1.85 to 2.00, containing scattering elements preferably having a refractive index no different from no, preferably different by at least 0.1, preferably by at least 0.2 and in particular by at least 0.25; and
- a preferably electrically insulating layer partially structured in its thickness, this layer being of given composition and of refractive index $n_3$ of 1.70 to 2.3, preferably of 1.80 to 2.10 and in particular of 1.85 to 2.00, which partially structured layer is located (preferably directly) on the light extraction layer and especially under and making contact with the grid—if appropriate the absolute value of the difference $n_3 - n_4$ is preferably smaller than 0.1—which partially structured layer is formed:
  from a region (located furthest from the light extraction layer) structured with cavities, this preferably electrically insulating region containing the non-electrically conductive fields, the cavities at least partially containing the metal grid; and
  from another region located closest to the light extraction layer and called the low (unstructured) region, preferably located directly on the light extraction layer and preferably electrically insulating.

Of course, the partially structured layer is not entirely under the grid. The bottom of the cavities is under the grid. The structured region at least partially houses the metal grid.

In other words, the carrier comprises on the same side as the first surface:
- under the metal grid, an electrically insulating light extraction layer that typically extracts light via bulk and/or surface scattering of light, of given thickness $e_0$, preferably comprising (consisting of):
  the first surface of the substrate, which surface is a scattering surface (textured in order to scatter light); and/or
  an additional scattering layer (preferably directly) on the first surface of the (flat or textured) substrate, preferably (essentially) made of a mineral material containing scattering elements, for example of a material the refractive index $n_4$ of which is from 1.7 to 2.3, preferably from 1.80 to 2.10, and in particular from 1.85 to 2.00, containing scattering elements preferably having a refractive index $n_e$ different from $n_4$, preferably different by at least 0.1, preferably by at least 0.2 and in particular by at least 0.25; and a layer partially structured in its thickness, this layer being of given composition and of refractive index $n_3$ of 1.70 to 2.3, preferably of 1.80 to 2.10 and in particular of 1.85 to 2.00, which partially structured layer is located (preferably directly) on the light extraction layer and preferably making contact with the grid—if appropriate (if $n_3$ and $n_4$ are different) the absolute value of the difference $n_3$–$n_4$ is preferably smaller than 0.1—which partially structured and preferably electrically insulating layer is formed:

from a region (located furthest from the light extraction layer) structured with cavities, this region containing the non-electrically conductive fields, the cavities at least partially containing the metal grid; and under the metal grid, from another region located closest to the light extraction layer and called the low (unstructured) region, preferably located directly on the light extraction layer.

The separation H between the surface called the high surface of the non-electrically conductive fields (i.e. the surface furthest from the substrate), and the surface of the metal grid (i.e. the surface called the upper surface, furthest from the substrate) is, in absolute value, smaller than or equal to 100 nm, preferably smaller than or equal to 50 nm, and even more preferably smaller than or equal to 20 nm. Furthermore, the H between the high surface and the surface of the grid is preferably measured at the centre of the cavity.

By inserting such a light extraction layer having a light scattering function between the grid and the glazing substrate, optical performance is considerably increased.

By placing the light extraction layer under the grid and not between the grid, it becomes possible to adjust the thickness of the grid (in particular influencing its sheet resistance) and the thickness of this light extraction layer (influencing its light extraction properties) independently. The total thickness E between the first surface of the substrate and the (lower face of the) metal grid is preferably at least 1 µm and better still between 5 and 30 µm.

The small size of the separation H ensures that the surface of the grid/high surface assembly is sufficiently smooth. Thus, the risk of short-circuits is limited. The grid may either protrude from the high surface or be recessed in the cavities.

However, it is preferable for the grid to be set back from the high surface especially for the sake of ease of production.

The thickness $e_2$ of the metal grid is (preferably) smaller, larger or equal to the height $e_c$ of the cavities between the non-electrically conductive fields, preferably to $e_c$ by at least 80 nm or even 100 nm. It is easy to produce deep cavities and therefore $e_c$ can easily be made larger than the grid even if the latter is thick.

A is chosen to be smaller than or equal to 50 µm in order to limit the visibility of the strands to the naked eye, and $e_2$ is chosen to be at least 100 nm in order to obtain the objective of a low Rsquare more easily.

The strands are interconnected in the active zone of the OLED or (only) connected via their ends to electrical contacts.

The presence alone of many scattering elements on the surface of the additional scattering layer, or of the texture of the scattering first surface, could, because of their excessive roughness, be a source of short-circuits if the grid were deposited directly thereon.

Therefore, it is preferable for the grid not to make contact with the surface of the light extraction layer but to be anchored in the partially structured layer, which is preferably flat locally, at least on the scale relevant to short-circuits, i.e. over a length scale smaller than 50 µm and for example larger than 10 µm.

The partially textured layer is preferably located directly on the light extraction layer, and in particular is preferably able to cover or fill the roughness profile of the scattering first surface of the glass or of an additional scattering layer. Therefore, the high surface of the partially structured layer does not reproduce (or amplify) the roughness of the scattering first surface of the glass or of the additional scattering layer.

Therefore, it is preferable for the partially structured layer to contain few or no scattering particles, and even for it not to have a (significant) scattering function.

In order to preserve the high surface and make it as smooth as possible locally, (at least) the structured region, which is especially made of a vitreous material and preferably of an enamel, is preferably free from scattering particles throughout its thickness.

It may also be preferable for the structured region, which is preferably electrically insulating and preferentially made of a vitreous material and even better of an enamel, to contain no or few pores on its surface and even in its thickness.

Furthermore, in order to preserve the surface of the bottom of the cavities, the low region, which is especially made of a vitreous material and preferably of an enamel, is preferably free from scattering particles throughout its thickness. The low region possibly (only) contains pores (air or gas bubbles) whether they scatter light or not, especially in a concentration by volume smaller than 0.5%, preferably smaller than 0.2% and in particular smaller than 0.1%.

Regarding the scattering of the light, the low region, which is especially made of a vitreous material and preferably of an enamel, may contain pores but in amounts that are so small and/or that are so small (non-scattering) that they do not cause the partially structured layer to scatter light, especially not increasing the haze value of the substrate/light extraction layer/partially structured layer assembly relative to the haze of the substrate/light extraction layer alone.

The partially structured layer, which is especially made of a vitreous material and preferably of an enamel, may contain pores but in amounts that are so small and/or that are so small (non-scattering) that they do not cause this layer to scatter light (significantly) and preferably do not roughen the high surface.

The high surface of the partially structured layer, which is especially made of a vitreous material and preferably of an enamel, may preferably have an Ra roughness (the Ra parameter, which is the arithmetic mean divergence of the profile, is well known) lower than 5 nm, better still lower than 3 nm and even than 1 nm. The Ra roughness may be defined according to standard ISO4287 and measured by atomic force microscopy at 256 points in a 10 µm by 10 µm area.

Furthermore, the number of macroscopic defects (of size larger than 5 µm) in the high surface is preferably smaller than 1 per cm$^2$. This number may be evaluated by optical microscopy.

The surface of the layer intended to form the partially structured layer may exhibit large-scale undulations, for example having an amplitude of 1 µm over a lateral period W of 100 to 200 µm. These undulations:

do not adversely affect the structuring because the cavity width $A_c$ is much smaller than W, or adversely affect the formation of the etching mask, in particular in the case of a photoresist.

As a result, the high surface of the partially structured layer may exhibit the same undulations for a B of at least 300 μm. They are not a source of short-circuits.

The partially structured layer may have a thickness e3 larger than 3 μm and preferably smaller than 30 μm.

In order to obtain a high surface that is as flat as possible locally, in particular if the light extraction layer is an additional scattering layer made of a high-index matrix with scattering particles dispersed in the matrix, it is preferable for $e_3$ to be larger than 3 μm and even 5 μm and preferably smaller than 20 μm and better still 15 μm. The preferred range is from 5 to 15 μm.

In order to obtain a high surface that is as flat as possible locally, in particular if the light extraction layer is a scattering surface such as, for example, the first surface of the glass, it is preferable for $e_3$ to be larger than 5 μm and even 8 μm and even better still larger than 9 μm, and for $e_3$ preferably to be smaller than 30 μm and better still smaller than or equal to 25 μm. The preferred range is from 9 to 20 μm.

In one advantageous embodiment that is robust and simple to implement, the preferably electrically insulating partially structured layer is a mineral layer preferably based on one or more oxides or essentially made of one or more oxides, and even more preferably is a vitreous material, in particular an enamel, based on a molten glass frit.

The partially structured layer may for example be made of the same vitreous material as the additional scattering layer, or of another vitreous material.

When these vitreous materials are identical, the interface between the additional scattering layer and the partially structured layer is not necessarily "marked"/visible even when they are deposited one after the other.

The enamel partially structured layer may contain pores but in amounts that are so small and/or that are so small that they do not cause the layer to scatter light (significantly) and/or preferably do not roughen the high surface.

The additional scattering layer may be a monolayer or a multilayer, and it may contain a gradient of scattering elements (the number of scattering elements, especially particles and/or bubbles, preferably decreasing in the direction of the grid) and may especially be a bilayer with a gradient of scattering elements and/or different scattering elements (different in nature and/or concentration).

The, enamel especially, additional scattering layer may have a thickness $e_4$ comprised between 1 μm and 80 μm, in particular of 2 to 30 μm and even of 3 to 20 μm.

The scattering elements, scattering particles in particular, may be distributed homogenously in the vitreous material. They may alternatively be distributed heterogeneously, in order to produce gradients for example. The additional scattering layer may also consist of a number of elementary layers that differ from one another in that the nature, size or proportion of scattering elements that they contain is different.

Preferably, the scattering elements are chosen from particles and pores. The additional scattering layer may contain both particles and pores.

The particles are preferably chosen from alumina particles, zirconia particles, silica particles, titanium dioxide particles, calcium carbonate particles and barium sulphate particles. The scattering layer may comprise a single type of particle, or a number of different types of particle.

The scattering elements preferably have a characteristic size allowing them to scatter visible light. The scattering elements (especially particles) preferably have an average diameter, determined by dynamic light scattering (DLS), comprised between 0.05 and 5 μm, and in particular between 0.1 and 3 μm.

The weight concentration of scattering particles in the additional scattering layer is preferably comprised in a range extending from 0.2 to 10%, especially from 0.5 to 8%, and even from 0.8 to 5%.

Although the chemical nature of the scattering particles is not particularly limited, they are preferably chosen from $TiO_2$ particles and $SiO_2$ particles.

A scattering layer taking the form of a polymer filled with scattering particles, for example as described in EP 1 406 474, may be used.

The optional additional scattering layer is preferably a mineral layer, preferably one based on one or more oxides, better still one essentially made of one or more oxides, and the partially structured layer is preferably a mineral layer, preferably a layer based on one or more oxides, and is especially identical to the additional scattering layer, and, preferably, the glass is mineral glass.

In a preferred embodiment, the additional scattering layer is a mineral layer located directly on the substrate, said layer being made of a high-index mineral material based on one or more oxides, which mineral material is preferably a vitreous material, in particular an enamel, and the scattering elements are preferably mineral in nature (pores, precipitated crystals, hollow or solid particles for example of oxides or non-oxide ceramics, etc.).

Advantageously, "all-mineral" solutions are preferred, in particular:

the substrate is preferably made of mineral glass; the light extraction layer comprises (even consists of) an additional scattering layer containing scattering elements and a material that comprises (especially consists of) a vitreous material, preferably an enamel; and the composition of the partially structured layer comprises (especially consists of) a vitreous material, preferably an enamel, which composition is preferably identical to the material of the additional scattering layer;

and/or the first (made) scattering surface of the substrate, which is preferably made of mineral glass, forms part or even is the light extraction layer; and the composition of the partially structured layer comprises (especially consists of) a vitreous material, preferably an enamel.

An enamel layer according to the invention (partially structured layer and/or additional scattering layer) is preferably obtained by a process in which a glass frit (of the same chemical composition as the material) is mixed with a typically organic medium in order to form a paste (optionally containing scattering particles) that is preferably deposited by screen printing on the first mineral glass surface before being baked.

For an additional scattering layer made of enamel, the pores are preferably formed during the baking by elimination of organic compounds, for example from the medium. They are preferably closed and not connected.

Enamel scattering layers and high-index enamel layers located on scattering layers are known in the prior art and are for example described in EP 2 178 343 and WO 2011/089343. High-index compositions are also described in patents WO 2010/084922 and WO 2010/084925.

The partially structured layer made of an enamel of index $n_3$, which layer preferably contains no scattering particles, may have a high bismuth oxide content, for example a bismuth oxide content of at least 40% by weight and better still at least 55% and preferably at most 85%. Preferably, an enamel having a glass transition temperature Tg lower than 520° C. and better still lower than or equal to 500° C. or even lower than or equal to 490° C., and especially of at least 450° C., will be chosen. The Tg is measured by differential scanning calorimetry (DLC). The baking temperature for forming the enamel is above the Tg but must not soften the glass substrate. Preferably, the baking temperature is below 600° C. and even below 570° C., especially when the Tg is 500° C. or less.

The additional scattering layer, which preferably contains scattering particles and optionally pores, may (also) be made of (scattering) enamel. Preferably, an enamel having a glass transition temperature Tg lower than 800° C. and better still lower than or equal to 550° C. or even lower than or equal to 500° C. will be chosen. The scattering enamel may have a high index, of at least 1.7, and have a high bismuth oxide content, for example a bismuth oxide content of at least 40% by weight and better still at least 55% by weight and preferably at most 85%. The Tg is measured by differential scanning calorimetry (DLC). The baking temperature for forming the enamel is above the Tg but must not soften the glass substrate. Preferably, the baking temperature is below 600° C. and even below 570° C., especially when the Tg is 500° C. or less.

The first surface may be rough enough to scatter light. Rough interfaces intended to extract light emitted by organic layers of OLEDs are known and for example described in patent applications WO 2010/112786, WO 02/37568 and WO 2011/089343. The roughness of the first surface of the substrate may be obtained by any appropriate known means, for example by acid etching (hydrofluoric acid), sandblasting or abrasion. The texture of the first surface of the (made) scattering substrate is preferably aperiodic and especially random, for application to white light.

The roughness of the substrate is characterized by the well-known roughness parameter Ra which is the arithmetic mean deviation of the profile, quantifying mean amplitude. Ra may be defined according to standard ISO4287 and measured by atomic force microscopy. Typically Ra is micron-sized and preferably lower than 5 μm and even than 3 μm.

When the adjective "scattering" is used to qualify the scattering first face and/or the additional scattering layer, it will preferably be understood that the haze (of the assembly made up of the glazing substrate and the light extraction layer and optionally the partially structured layer) is at least 60%, better still 70, and even 80% or 90%. The haze, sometimes called "veiling", is measured using a haze meter, such as that sold by BYK, and the protocol defined in standard ASTM D1003.

When the substrate does not have a scattering functionality (i.e. a rough scattering first surface) it is preferable for it to have a haze lower than 5%, better still than 2% and even lower than 1%.

Moreover, it is preferable for
   the assembly made up of the substrate and the light extraction layer to have a light transmission $T_L$ of at least 40%, even 50%, and preferably an absorption of at most 5%, even 3%; and
   even for the substrate/light extraction layer (preferably made of a vitreous material/enamel)/partially structured layer (preferably made of a vitreous material, better still of an enamel and located directly on the light extraction layer) assembly to have a $T_L$ of at least 40%, even 50%, and preferably an absorption of at most 5%, even 3%.

Advantageously, the preferably electrically insulating partially structured layer (and preferably the electrode) covers at least 80%, especially 90% and even 95% of the surface of the substrate.

The partially structured layer according to the invention may extend over a large area, for example an area larger than or equal to 0.02 m$^2$ or even larger than or equal to 0.5 m$^2$ or to 1 m$^2$. The grid according to the invention may extend over a large area, for example an area larger than or equal to 0.02 m$^2$ or even larger than or equal to 0.5 m$^2$ or to 1 m$^2$.

Typically a layer may be added, which layer acts as a barrier to alkali metals or as a protective layer during etching:
   between the first surface of the mineral glass substrate (which surface is made scattering or is a conventional flat polished surface) and the additional scattering layer; and/or
   between the first surface of the mineral glass substrate (which surface is made scattering or is a conventional flat polished surface) and the preferably electrically insulating partially structured layer.

The surface of this layer, which is for example deposited by physical vapour deposition (PVD), is generally conformal with the surface of the substrate, the underlying surface, and therefore it does not play (or plays only a small) planarizing role.

The layer acting as a barrier to alkali metals or as a protective layer during etching may be based on silicon nitride, silicon oxycarbide, silicon oxynitride, silicon oxycarbonitride, silica, alumina, titanium oxide, tin oxide, aluminium nitride, titanium nitride or Ti(Zr)O and for example be of thickness smaller than or equal to 30 nm and preferably larger than or equal to 3 nm or even 5 nm. It may be a question of a multilayer.

A moisture barrier layer may be added to the substrate if it is made of plastic (whether its surface is flat or made scattering). The barrier layer may be based on silicon nitride, silicon oxycarbide, silicon oxynitride, silicon oxycarbonitride, silica, alumina, titanium oxide, tin oxide, aluminium nitride, or titanium nitride and for example be of thickness smaller than or equal to 10 nm and preferably larger than or equal to 3 nm or even 5 nm. It may be a question of a multilayer.

In the present invention, all the refractive indexes are defined at 550 nm.

The electrically conductive carrier according to the invention may be used in a bottom-emitting organic light emitting device or in a top- and bottom-emitting organic light emitting device.

In the present invention, each and every dielectric layer may be doped. The term "doping" is conventionally understood to mean a presence of the element in an amount smaller than 10% by weight of metal element in the layer. A metal oxide or nitride may especially be doped to between 0.5 and 5%. Any metal oxide layer according to the invention may be a simple oxide or a mixed oxide, independently of whether this layer is doped or not.

In the present invention, when it is stated that a layer or coating (comprising one or more layers) is deposited directly under or directly on another deposit, what is meant is that no other layer can be interposed between these two deposits.

The cavities (which form a grid defining the layout of the metal grid) are at least partially filed by the metal grid. The (U-shaped) cavities are bounded by a bottom and right flanks (normal i.e. perpendicular to the substrate) or flanks that flare with distance from the substrate. A horizontal distance L is defined (between the high surface and the low surface) such that $L \leq 1.4e_c$, better still $\leq 1.2e_c$ in order to preserve transparency. Thus, the (lateral) extent of the cavities is preferably limited in order to decrease the width of the strands to the best amount. Furthermore, for a given Rsquare it is preferable for the strands to be large in thickness rather than large in size in order to increase transparency.

The cavities may form one-dimensional trenches, which are optionally regularly spaced (by a distance $B_c$) and notably separate (at least in the light-emitting zone), of any shape, for example linear or serpentine trenches.

The cavities may form a periodic or aperiodic mesh, i.e. a (two-dimensional) network of interconnected apertures, of uniform or nonuniform cell size and of any shape: especially of geometric shape (square, rectangle, honeycomb, etc.). The cell size may be defined by a maximum width (between two mesh points) $B_c$.

The height $e_c$ of the cavities separating the non-electrically conductive fields may be at least 50 nm, even 80 nm or 100 nm and is preferably smaller than 1500 nm or 1200 nm, and the width $A_c$ of said cavities may be smaller than or equal to 50 µm, better still than 30 µm, and is preferably at least 1 µm or 1.5 µm. $e_c$ is preferably measured at the centre of the cavity.

If a grid strand emerges from the cavity, it is preferable for the strand not to extend over the edges of the high surface on the cavity periphery, or over a small distance smaller than 500 nm, better still smaller than 200 nm and even smaller than 50 nm or 10 nm.

The grid may take the form of linear strands running parallel to one another and connected to (together via) electrical contacts at their ends and/or even take the form of closed patterns or meshes (strands interconnected to one another defining closed patterns), for example geometric (rectangular, square, polygonal, honeycomb, etc.) patterns of nonuniform shape and/or nonuniform size. The grid may contain a linear zone (strips of strands or tracks) and a zone containing closed patterns (meshed strands or tracks). The structure of the partially structured layer will be adapted to this end.

The thickness e2 is not necessarily constant in a cavity. It is preferably defined at the centre (what is called centre thickness).

The width A is not necessarily constant in a cavity. It may be defined level with the upper surface of the grid and/or preferably as the maximum width.

B may be defined as the maximum distance between strands, this distance B especially corresponding to a maximum distance between two points on a mesh or the maximum distance between two separate neighbouring trench-type strands (whether straight or not).

A and B may vary from one strand to another. Since the grid is possibly nonuniform and/or the edges of the strands are possibly inclined, the dimensions A and B are therefore preferably average dimensions over the strands, just like $e_2$. The thickness $e_2$ may be smaller than 1500 nm, better still than 1000 nm, and especially from 100 nm to 1000 nm, or than 800 nm, and in particular from 200 nm to 800 nm, or than 650 nm.

The (average, preferably maximum) width A is smaller than 30 µm, and preferably is 1 to 20 µm and even more preferably is 1.5 to 20 µm or to 15 µm.

B may be at least 50 µm and even at least 200 µm and B is smaller than 5000 µm, better still than 2000 µm and even 1000 µm.

Another possible feature of the metal grid according to the invention is that it has a coverage T that is preferably smaller than 25% and better still than 10%, and even than 6% or than 2%.

In particular, it may be desirable for B to be between 2000 and 5000 µm when $e_2$ is between 800 and 1500 nm and A is comprised between 10 and 50 µm. This corresponds to a coverage comprised between 0.4 and 6.0%.

In particular, it may be desirable for B to be between 200 and 1000 µm when $e_2$ is smaller than 500 nm and A is comprised between 3 and 20 µm or even 3 to 10 µm. This corresponds to a coverage comprised between 0.5 and 22% or even 0.5 to 11%.

Preferably, the metal grid is obtained by slivering and even better directly in the cavities.

When deposited using a physical vapour deposition (PVD) technique such as magnetron sputtering, shadowing effects, through apertures in a mask such as a (photo) resist mask, cause lateral zones of the strands to become cupped, forming a break in morphology, that sometimes generates short-circuits even if the surface roughness of the grid is quite low.

Furthermore, silvering is simple, less complex than PVD (no vacuum tools etc.) and suitable for any size of grid. Surprisingly, silvering, which is conventionally used to form "whole" layers, is entirely suitable for depositing deposits in cavities. Moreover, the electrical conductivity of the silver deposited by slivering is satisfactory.

In one advantageous embodiment (especially when the cavities are obtained by isotropic etching and all or some of the strands are formed by silvering through apertures in a (photo) resist mask), the strands are elongate—separate or interconnected (at least in the light-emitting region) especially to form a mesh—the strands having, along their length, a central zone between peripheral lateral zones, the peripheral lateral zones (being flat and) lying flush with the high surface, and the surface roughness of the central zone, which is preferably set back from the high surface, is higher than the surface roughness in the peripheral zones.

The Rq in each (flat) peripheral lateral zone is preferably at most 5 nm and even at most 3 nm and even at most 2 nm or else 1 nm. Furthermore, the Rmax (maximum height) in each (flat) peripheral lateral zone is at most 20 nm and even at most 10 nm.

These flat smooth lateral zones decrease the risk of leakage currents relative to the cupped regions created by PVD.

They also decrease the total roughness of the strands.

Preferably, each peripheral lateral zone is of width L1 larger than or equal to the height $e_c$ of the cavity, with $L1 \leq 1.4e_c$ and even $L1 \leq 1.2e_c$.

L1 is generally substantially equal to the horizontal distance L.

The (well-known) roughness parameter Rq (rms roughness) in the (roughest) central zone is at least 10 nm and even at least 20 nm (and preferably at most 60 nm). Furthermore, the Rmax (maximum height) in the (rough) central zone is preferably at least 100 nm and even at least 150 nm (and preferably at most 500 nm).

The roughness of the central zone will depend on the thickness of the metal grid, and will increase with this thickness.

The Rmax and Rq of the grid may be defined according to standard ISO4287 and be measured by atomic force microscopy.

According to the invention a lateral zone flush with the high surface may be rigorously in the same plane as the high surface or a distance therefrom of at most 10 nm and better still of at most 5 nm.

Furthermore, it is preferable for the central zone to be set back from the high surface (H extending up to the high surface at most).

Advantageously, the metal grid according to the invention may have a sheet resistance smaller than or equal to 10 ohm/square, preferably smaller than or equal to 5 ohm/square, and even 1 ohm/square.

The grid may be based on a pure metal chosen from silver, aluminium, even platinum, gold, copper, palladium and chromium, or based on said metal alloyed or doped with at least one other metal: Ag, Au, Pd, Al, Pt, Cu, Zn, Cd, In, Si, Zr, Mo, Ni, Cr, Mg, Mn, Co, Sn. The one or more metals of the grid are more particularly chosen from the group formed by silver, copper, aluminium, gold and alloys based on these metals, and is preferably based on silver. Silver (possibly oxidized on its surface) is preferred.

The metal grid may be a single (silver) layer or a multilayer (preferably containing at least 80% even 90% silver).

The metal grid may be a multilayer, especially a silver multilayer comprising (even consisting of) in this order:
  a first metal layer, especially a tie layer (located directly on the bottom of the cavities i.e. it is the metal layer closest to the bottom of the cavities) preferably made of a first metal, which is preferably based on silver or even consists of silver, forming less than 15% and even 10% of the total thickness $e_2$ of the grid and/or at least 3 nm, 5 nm or even at least 10 nm and preferably less than 100 nm and even less than 50 nm of the total thickness $e_2$; and
  a second metal layer based on a second metal (located on the first layer i.e. on the side opposite the substrate), which especially forms a discernible interface with the first layer, and which is preferably chosen from silver, aluminium or copper, forming at least 70%, 80% and even 90% of the total thickness $e_2$ of the grid, which second layer is preferably based on silver or consists of silver, in particular as the first layer.

It is especially possible to form a silver-based first metal layer using a first deposition method, silvering or vacuum deposition (sputtering) for example, preferably with a thickness of at least 20 nm and even 30 nm, and then to form a silver-based second metal layer with a thickness of at least 3 nm or even 5 nm using a second deposition method, preferably electroplating. The advantage of electroplating is that it has a higher silver usage level than silvering and that it is a less expensive process than sputtering. The metal grid may be a multilayer of layers of different materials, the last layer of this multilayer for example being a layer protecting against corrosion (water and/or air), which protective layer is made of a different material, for example a metal, especially not silver, to the underlying metal layer, and has a thickness smaller than 10 nm, better still than 5 nm or even 3 nm. This layer is particularly useful for a sliver-based grid.

The metal grid may furthermore be a multilayer of two layers made of different materials, and is for example a bilayer composed of
  a (single) metal layer made of the aforementioned materials and preferably based on silver, which layer is preferably at least 100 nm in thickness and for example deposited by silvering or vacuum deposition (sputtering); and
  an overlayer protecting against corrosion (water and/or air), which protective overlayer is made of a different material, for example a metal, especially not silver, to the metal layer, and has a thickness smaller than 10 nm, better still than 5 nm or even 3 nm.

The protective overlayer may be deposited using the same deposition technique as the underlying metal layer, for example by vacuum deposition (evaporation, sputtering) in the same deposition tool, or preferably by wet processing, for example by silvering.

The metal grid may be a multilayer of layers of different materials, for example a trilayer composed of:
  the aforementioned metal multilayer, which preferably has at least one silver metal second layer and even preferably is a silver multilayer, and
  an overlayer protecting against corrosion (water and/or air), which protective layer is for example made of a metal other than silver, has a thickness smaller than 10 nm, even better smaller than 5 nm or even 3 nm, and is deposited by vacuum deposition (evaporation or sputtering) and preferably by electroplating.

The protective overlayer may be deposited using the same technique used to deposit (the last layer of) the grid, by electroplating for example.

The protective overlayer preferably comprises a metal layer based on at least one of the following metals: Ti, V, Mn, Fe, Co, Cu, Zn, Zr, Hf, Al, Nb, Ni, Cr, Mo, Ta, W, or based on an alloy of at least one of said materials, preferably based on Ni or Ti, based on an Ni alloy, or based on an NiCr alloy.

For example, it may consist of a layer based on niobium, tantalum, titanium, chromium or nickel or an alloy made from at least two of said metals, such as a nickel/chromium alloy.

In particular, a thin layer based on a metal chosen from niobium Nb, tantalum Ta, titanium Tl, chromium Cr or nickel Ni or an alloy made from at least two of these metals, especially an alloy of niobium and tantalum (Nb/Ta), niobium and chromium (Nb/Cr), tantalum and chromium (Ta/Cr) or nickel chromium (Ni/Cr), is preferred.

A thin metal blocking layer may also be easily provided without degrading conduction by the silver metal layer. This metal layer may preferably be deposited in an inert atmosphere (i.e. without intentional introduction of oxygen or nitrogen) selected from the noble gases (He, Ne, Xe, Ar, Kr). It is not excluded or problematic for the surface of this metal layer to be oxidized during the subsequent deposition of a metal-oxide-based layer.

The thin blocking layer may be partially oxidized, i.e. of the $MO_x$ type, where M represents the metal and x is a number lower than the stochiometry ratio of the oxide of the metal, or an oxide of two (or more) metals M and N, of the $MNO_x$ type. Mention may for example be made of $TiO_x$ and $NiCrO_x$. x is preferably comprised between 0.75 times and 0.99 times the normal stoichiometry ratio of the oxide. For a monoxide, x may especially be chosen to lie between 0.5 and 0.98, and for a dioxide between 1.5 and 1.98.

As one particular variant, the thin blocking layer is based on $TiO_x$ and x may in particular be such that $1.5 \leq x \leq 1.98$ or $1.5 < x < 1.7$, or even $1.7 \leq x \leq 1.95$.

The thin blocking layer may be partially nitrided. Therefore, it is not deposited in its stoichiometric form but in a substoichiometric form of the $MO_x$ type, where M represents the metal and y is a number lower than the stoichiometry ratio of the nitride of the metal. y is preferably comprised between 0.75 times and 0.99 times the normal stoichiometry ratio of the nitride.

In the same way, the thin blocking layer may also be partially oxynitrided.

The thin blocking layer is preferably obtained by sputtering or evaporation especially on a (last) grid material deposited in the same vacuum tool by sputtering or evaporation (without venting to atmosphere).

The (metal) grid may be deposited directly on the partially structured layer or on a dielectric underlayer called a tie layer (having a bonding function facilitating deposition of the grid material), which tie layer is located directly on the cavities (on the bottom and preferably all or part of the flanks of the cavities) of the partially structured layer, and is preferably absent from the high surface, this tie layer preferably being a mineral layer, especially one made of one or more oxides and, for example, a transparent conductive oxide. It is of thickness $e_A$ smaller than 30 nm even than 10 nm. Naturally, the height of the cavity $e_c$ is preferably chosen to be larger than $e_A$ and better still $e_c-e_A$ is greater than 50 nm. This tie layer is easily deposited by magnetron sputtering.

The electrically conductive carrier may comprise an electrically conductive coating that covers, preferably directly, the non-electrically conductive fields 31 and the metal grid 20, which electrically conductive coating especially has a thickness $e_5$ smaller than or equal to 500 nm, a resistivity $\rho_5$ lower than 20 Ω·cm, even than 10 Ω·cm or than 1 Ω·cm and even than $10^{-1}$ Ω·cm and higher than the resistivity of the metal grid, and a given refractive index $n_5$ of at least 1.55, better still of at least 1.6 and even better still of at least 1.7.

The resistivity is preferably adjusted depending on the inter-strand distance. It is inversely proportional to B.

For example, for B=1000 μm and $e_5$=100 nm, a resistivity of less than 0.1 ohm·cm will preferably be used. For a B of 300 μm and $e_5$=100 nm, a resistivity of less than 1 ohm·cm is preferable.

The electrically conductive coating according to the invention contributes, via its resistivity, its coverage of the grid, and its thickness, to a better distribution of the current.

The surface of the electrically conductive coating may preferably be intended to make contact with the organic layers of the OLED: especially the hole injection layer (HIL) and/or the hole transport layer (HTL) or to form part of the HIL or HTL, or play the role of the HTL or HIL.

The (external) surface of the electrically conductive coating may furthermore exhibit very large-scale undulations, typically over 0.1 mm or one or more millimeters. Moreover, the substrate, and therefore the external surface, may be curved.

The electrically conductive coating is a monolayer or a multilayer.

The coating may have (a last layer with) a work function higher than the metal grid. The coating may contain a work-function-matching layer that may, for example, have a work function Ws of 4.5 eV or more preferably 5 eV or more.

Thus, the electrically conductive coating may comprise (or consist of) a mineral layer, preferably smaller than 150 nm in thickness, especially for matching work function, of refractive index $n_a$ comprised between 1.7 and 2.3, which layer, preferably the last layer of the coating (i.e. the layer furthest from the substrate) is based on a simple or mixed transparent electrically conductive oxide, and especially based on one or more of the following, optionally doped, metal oxides: tin oxide, indium oxide, zinc oxide, molybdenum oxide $MoO_3$, tungsten oxide $WO_3$, vanadium oxide $V_2O_5$, ITO, IZO, $Sn_xZn_yO_z$.

This mineral layer preferably has a thickness smaller than or equal to 50 nm even 40 nm or even 30 nm, and easily has a resistivity lower than $10^{-1}$ Ω·cm.

A layer chosen from ITO, $MoO_3$, $WO_3$ and $V_2O_5$ deposited by physical vapour deposition, in particular magnetron sputtering, is preferably chosen.

The electrically conductive mineral layer coating is preferably obtained by sputtering or evaporation especially onto a (last) grid material deposited by the same method.

The expression "indium tin oxide" (or even "tin-doped indium oxide" or the term "ITO") will preferably be understood to mean a mixed oxide or a mixture obtained from oxides of indium (III) ($In_2O_3$) and tin (IV) ($SnO_2$), preferably in weight proportions comprised between 70 and 95% for the first oxide and 5 to 20% for the second oxide. A typical weight proportion is about 90% by weight of $In_2O_3$ for about 10% by weight of $SnO_2$.

The electrically conductive coating may consist of the mineral layer of refractive index $n_a$ comprised between 1.7 and 2.3, which is then equal to $n_5$.

The electrically conductive coating may comprise or consist of, or at least the last layer (of the coating) i.e. the layer furthest from the substrate, may comprise or consist of, an organic layer, made of one or more conductive polymers, of submicron-sized thickness e'2 and of refractive index $n_b$ of at least 1.55 and better still 1.6, this polymer layer possibly playing the role of a hole transport layer (HTL) or hole injection layer (HIL) in an organic light-emitting system.

The electrically conductive coating may consist of the organic layer of refractive index $n_b$ comprised between 1.7 and 2.3, which is then equal to $n_5$.

For example, it may be a question of a layer of one or more conductive polymers from the polythiophene family, such as PEDOT, i.e. poly(3,4-ethylene dioxythiophene) or PEDOT/PSS, i.e. poly(3,4-ethylene dioxythiophene) mixed with poly(styrenesulfonate).

By way of commercially available PEDOT or PEDOT: PSS, mention may be made of the following products sold by Heraeus:
  Clevios™ FET of ρ of less than $10^{-2}$ ohm·cm; or
  Clevios™ HIL 1.1. of ρ of about 10 ohm·cm.

The conductive polymer forms part of the electrode and also optionally serves as a hole injection layer (HIL).

The electrically conductive coating may be a multilayer and comprises (preferably directly) under the aforementioned mineral layer (which is especially the last layer) or the aforementioned organic layer (which is especially the last layer), a first layer directly on the metal grid (monolayer or multilayer grid), which first layer is made of a transparent electrically conductive oxide of thickness e'5 smaller than 200 nm and of index n'5 comprised between 1.7 and 2.3, the difference in absolute value of n'5−$n_3$ preferably being <0.1, this layer especially being chosen from:
  preferably a layer based on zinc oxide especially doped with aluminium and/or gallium (AZO or GZO), or optionally on ITZO; and/or
  an (especially amorphous) layer for example based on tin zinc oxide SnZnO preferably of thickness smaller than 100 nm, or based on indium zinc oxide (denoted IZO), or based on indium tin zinc oxide (denoted ITZO).

The AZO or GZO layer may for example allow the thickness of the mineral layer, especially the ITO layer, to be decreased to less than 50 nm.

A layer made of a ZnO oxide is preferably doped with Al (AZO) and/or Ga (GZO), with the sum of the percentages by weight of Zn+A or Zn+Ga or Zn+Ga+Al or of Zn+ another dopant preferably chosen from B, Sc or Sb or even from Y, F, V, Si, Ge, Tl, Zr, Hf and even In, being at least 90% by total metal weight and better still at least 95% and even at least 97.

It may be preferable, in an AZO layer according to the invention, for the percentage by weight of aluminium over the sum of the percentages by weight of aluminium and of zinc, in other words Al/(Al+Zn), to be smaller than 10% and preferably smaller than or equal to 5%.

To achieve this, an aluminium-oxide and zinc-oxide ceramic target may preferably be used, this target being such that the percentage by weight of aluminium oxide over the sum of the percentages by weight of zinc oxide and of aluminium oxide, typically $Al_2O_3/(Al_2O_3+ZnO)$, is smaller than 14% and preferably smaller than or equal to 7%.

It may be preferable, in a GZO layer according to the invention, for the percentage by weight of gallium over the sum of the percentages by weight of zinc and of gallium, in other words Ga/(Ga+Zn), to be smaller than 10% and preferably smaller than or equal to 5%.

To achieve this, a zinc- and gallium-oxide ceramic target may preferably be used, this target being such that the percentage by weight of gallium oxide over the sum of the percentages by weight of zinc oxide and of gallium oxide, typically $Ga_2O_3/(Ga_2O_3+ZnO)$, is smaller than 11% and preferably smaller than or equal to 5%.

If the chosen layer is based on tin zinc oxide (SnZnO), the percentage by total metal weight of Sn will preferably range from 20 to 90% (and preferably from 80 to 10% for Zn) and in particular from 30 to 80% (and preferably from 70 to 20 for Zn), in particular the Sn/(Sn+Zn) weight ratio will preferably range from 20 to 90% and in particular from 30 to 80%.

The electrically conductive carrier may also comprise a temporary (removable) protective mineral layer, for example made of an oxide or nitride, in order to allow the carrier to be transported to the point of deposition of the electrically conductive coating, which point is separate from the point of deposition of the grid.

The substrate may be flat or curved, and furthermore may be stiff, flexible or semiflexible.

Its main faces may be rectangular, square or even any other shape (round, oval, polygonal, etc.). This substrate may be large in size, for example having an area larger than 0.02 m² or even 0.5 m² or 1 m² and the lower electrode may occupy substantially all this area (excluding structuring zones).

The substrate may be a substantially transparent substrate made of a mineral material or a plastic material such as polycarbonate PC, polymethyl methacrylate PMMA or even PET, polyvinyl butyral PVB, polyurethane PU, polytetrafluoroethylene PTFE, etc.

The substrate is preferably made of mineral glass, especially soda-lime-silica glass obtained by the float process, the float process consisting in pouring molten glass onto a molten tin bath. The substrate is preferably colourless and (alone) has a light transmission factor of at least 80%, even 90%, as defined in standard EN 410:1998.

The substrate may advantageously be made of glass having an absorption coefficient lower than 2.5 $m^{-1}$, preferably lower than 0.7 $m^{-1}$ at the wavelength(s) emitted by the OLEDs. Soda-lime-silica glasses containing less than 0.05% Fe III or $Fe_2O_3$, especially Diamant glass from Saint-Gobain Glass, Optiwhite glass from Pilkington, and B270 glass from Schott, will for example be chosen. Any of the extra-clear glass compositions described in document WO 04/025334 may be chosen.

The thickness of the glazing substrate may be at least 0.1 mm, and preferably lies in a range extending from 0.1 to 6 mm, especially from 0.3 to 3 mm.

The carrier such as defined above may furthermore comprise an organic light-emitting system deposited (preferably directly) on the electrically conductive coating, optionally including a hole transport layer HTL or a hole injection layer HIL.

The invention also relates to an organic light-emitting device incorporating the carrier such as defined above, the grid electrode forming what is called the lower electrode, i.e. the electrode closest the substrate.

A thin metal layer, referred to as a transparent conductive coating (TCC), for example made of Ag, Al, Pd, Cu, Pd, Pt In, Mo or Au and typically between 5 and 50 nm in thickness depending on the desired light transmission/reflection, may be used for the upper electrode.

The upper electrode may be an electrically conductive layer advantageously chosen from the metal oxides, and especially from the following materials: zinc oxide especially doped with aluminium ZnO:Al or gallium ZnO:Ga, or even indium oxide, especially doped with tin (ITO), or indium oxide doped with zinc (IZO).

More generally, any type of transparent electrically conductive layer may be used, for example what is called a transparent conductive oxide (TCO) layer of between 20 and 1000 nm in thickness may, for example, be used.

The OLED device may produce monochromatic light, especially blue and/or green and/or red light, or be suitable for producing white light.

There are a number of possible methods for producing white light: compounds (red, green, blue emission) may be blended in a single layer; three organic structures (red, green, blue emission) or two organic structures (yellow and blue) may be stacked on the face of the electrodes; a series of three adjacent organic structures (red, green, blue emission) may be used; and/or an organic structure emitting a single colour may be placed on the face of the electrodes, while layers of suitable phosphors are placed on the other face.

The OLED device may comprise a plurality of adjacent organic light-emitting systems, each emitting white light or, in series of three, red, green and blue light, the systems for example being connected in series.

Each row may for example emit a given colour.

OLEDs are generally divided into two large families depending on the organic material used.

If the light-emitting layers are formed from small molecules, the devices are referred to as small-molecule organic light-emitting diodes (SM-OLEDs). The organic light-emitting material of the thin layer consists of evaporated molecules, such as for example the complex $AlQ_3$ (tris(8-hydroxyquinone)aluminium), DPVBI (4,4'-(diphenyvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4,4-tri(N-carbazolyl)triphenylamine (TCTA) doped with fac-tris(2-phenylpyridine)iridium ($Ir(ppy)_3$).

In general, the structure of an SM-OLED consists of a stack of HILs (hole injection layers), an HTL (hole transport layer), an emissive layer and an ETL (electron transport layer).

Examples of organic light-emitting stacks are for example described in document U.S. Pat. No. 6,645,645.

If the organic light-emitting layers are polymers, polymer light-emitting diodes (PLEDs) are spoken of.

Preferably, the electrically conductive coating is resistant to the following OLED manufacturing steps:
resistant to 200° C. for 1 h;
resistant to a pH of 13 (cleaning solution);
resistant to a pH comprised between 1.5 and 2 (in particular when depositing PEDOT for the electrically conductive coating, before the stack of the OLED system); and
delamination resistance (scotch tape test).

A light extraction means may also be located on the exterior face of the substrate, i.e. on that face that will be opposite the first main face bearing the grid electrode. It may be a question of an array of microlenses or micropyramids, such as described in the article in the Japanese Journal of Applied Physics, Vol. 46, No. 7A, pages 4125-4137 (2007) or even of a satin finish, for example a satin finish obtained by etching with hydrofluoric acid.

Lastly, the invention relates to a process for manufacturing an electrically conductive carrier such as defined above, which method comprises the following steps in this order:
providing the substrate comprising:
the light extraction layer formed by the scattering first surface of the substrate and/or formed by the additional scattering layer (located preferably directly) on the substrate, which for example has a scattering surface; and
on the light extraction layer, what is called a high-index layer made of the composition with said refractive index $n_3$, which layer comprises said vitreous material that especially contains no scattering particles, and which layer optionally contains pore-type elements in a volume concentration lower than 0.5%, preferably lower than 0.2% and in particular lower than 0.1%, and preferably covers the roughness profile of the scattering surface,
forming blind apertures called cavities in the high-index layer, thus forming the partially structured layer, comprising:
producing, on the high-index layer, a discontinuous mask (layer of resist for example, photoresist in particular) containing a given arrangement of through-apertures (lines and/or meshes); and
etching the high-index layer through the through-apertures in the mask (of width $A_m$ substantially equal to A, and with an inter-aperture distance $B_m$ substantially equal to B), which apertures are especially right apertures (perpendicular to the substrate) or apertures that flare in the direction away from the substrate, and
forming the metal grid (with the separation H between the surface called the high surface of the non-electrically conductive fields and the surface of the metal grid), comprising:
a first deposition, in what is called the first deposition operation, of a first metal of the grid in the cavities, which deposition is preferably the only deposition for the metal grid, said first metal being deposited directly on the bottom of the cavities or on a dielectric (non-metal) underlayer carpeting all or part of the cavity (tie underlayer); and
an optional second deposition of a second metal of the grid on the first metal (at least partially in the cavities).

The etching is preferably carried out using a wet etching process. The depth of the cavities is controlled via the concentration of the solution, the solution type, the length of the etching operation, and the temperature of the solution. The mask, which is preferably a (photo)resist and even a positive photoresist, is then resistant to the etching solution.

The cavities have flanks that are right (perpendicular to the substrate) or that flare in the direction away from the substrate. They may have a cup-shaped or even semispherical (type) cross section.

An acid solution may in particular be used with a partially structured layer made of a vitreous material, and preferably the mask is a (photo)resist and especially a positive photoresist.

The etching obtained with a wet especially acid solution is isotropic in that the (especially acid) etching solution attacks (cuts) in every direction. The etching profile may be cup-shaped or of semi-spherical type.

Next, the optional tie layer is deposited before the first metal.

In particular when the etching is isotropic, at least a given one of said cavities (and preferably most and better still all of the cavities) has a width larger than the width of the through-aperture in the mask in the plane of the interface between the mask and the high-index layer, causing portions of surfaces of the mask (preferably a (photo)resist) facing the cavity to jut beyond the high surface.

Furthermore, surprisingly, the first deposition operation (preferably the only metal grid deposition operation) is a slivering operation that at least partially fills said cavity and the entire height of the flanks of the cavity and all or part of said surface portions (at least 50%, even at least 80%, or even at least 90% of the width of said surface portions), thus forming lateral peripheral strand zones that are smoother than the central strand zone opposite the aperture.

The mask, preferably a layer of resist for example, even better a layer of photoresist, is preferably removed by wet processing, in particular in an ultrasonic bath of a solvent (acetone etc.).

The silver deposited in the cavities using the silvering operation thus covers the mask (resist, even photoresist) and the flanks of the mask (of the resist, even photoresist). Preferably the metal grid has a central zone facing the aperture that is set back, in order to make removing the mask (resist especially photoresist) easier, in particular in an ultrasonic bath of a solvent (acetone etc).

The high-index layer preferably comprises (better still consists of) an enamel especially obtained from a first glass-frit-based composition. Preferably, the additional scattering layer possibly comprises (better still consists of) an enamel obtained from another glass-frit-based composition that is especially identical to the first composition.

The high-index layer comprising a vitreous material is preferably an enamel obtained by a process in which:
a glass frit of index $n_3$ is mixed with an organic medium so as to form a paste, called a planarizing paste, preferably without the addition of scattering particles;
said paste is deposited, for example by screen printing;
preferably directly on the mineral glass sheet (of scattering surface) or on a mineral barrier layer on the mineral glass sheet (of scattering surface) or even on the additional scattering layer; and
the assembly is baked.

The additional scattering layer comprising a vitreous material is preferably an enamel obtained by a process in which:
a glass frit is mixed with an organic medium and preferably with scattering particles so as to form a paste, called a scattering paste;

said paste is deposited, preferably directly on the (flat and polished or textured and scattering) mineral glass sheet, or on a mineral barrier layer on the mineral glass sheet; and the assembly is baked.

The additional scattering layer may be formed by baking the scattering paste before the planarizing paste is deposited, or both pastes may be baked together (one less baking step).

In one configuration, the scattering paste and the planarizing paste have the same composition, especially the same glass frit, and differ only by the presence or absence of scattering particles.

The organic medium is typically chosen from alcohols, glycols, and esters of terpineol. The proportion by weight of medium is preferably comprised in a range extending from 10 to 50%.

The (scattering and/or planarizing) paste may especially be deposited by screen printing, roll coating, dip coating, knife coating, by spraying, spin coating, flow coating or even slot die coating.

In the case of screen printing, a screen having a textile or metal mesh, flow coating tools and a doctor blade are preferably used, the thickness being controlled by the choice of the mesh of the screen and its tension, by the choice of the distance between the glass sheet (or additional scattering layer) and the screen, and by the pressure and speed of movement of the doctor blade. The deposits are typically dried at a temperature of 100 to 150° C. under infrared or ultraviolet radiation depending on the nature of the medium.

Conventionally, the glass frit (70-80% by weight) is mixed with 20-30% by weight of an organic medium (ethyl cellulose and organic solvent).

The paste may be subjected to a heat treatment at a temperature in a range extending from 120 to 200° C., for example in order to set the paste. Next, the paste may be subjected to a heat treatment extending from 350-440° C. in order to remove the organic medium. The bake for forming the enamel takes place above the Tg, typically at a temperature of below 600° C., and preferably below 570° C.

For the grid:
the first deposition operation is the only deposition operation (the only grid metal deposition operation) and it is a wet process and preferably a silvering operation; or
the first deposition operation is a physical vapour deposition operation for depositing the first sliver-based metal, or it is a wet process, preferably a silvering operation, and the second deposition operation is electroplating, preferably of a second silver-based metal.

The solution used in the silvering step may contain a silver salt, an agent for reducing silver ions and even a chelating agent. To carry out the silvering step, various conventional operating modes widely used in the field of mirror manufacturing, and for example described in chapter 17 of the text "*Electroless Plating—Fundamentals and Applications*", edited by Mallory, Glenn O.; Hajdu, Juan B. (1990) William Andrew Publishing/Noyes, may be employed.

In a preferred embodiment, the silvering step comprises bringing (immersion in a bath or by spraying) the substrate comprising the light extraction layer and the partially structured layer, and the through-aperture-containing mask (preferably photoresist) into contact with a mixture of two aqueous solutions, one containing the metal salt, for example silver nitrate, and the other containing the reducing agent for the metal ions ($Ag^+$ ions), for example sodium, potassium, aldehydes, alcohols, or sugars.

The most commonly used reducing agents are Rochelle salt (potassium sodium tartrate $KNaC_4H_4O_6 \cdot 4H_2O$), glucose, sodium gluconate and formaldehyde.

Preferably, before contact is made, the silvering step comprises a sensitizing step (for sensitizing the surface of the cavities) preferably comprising a treatment by a tin salt and/or an activating step (for activating the surface of the cavities) preferably comprising treatment by a palladium salt. The function of these treatments is essentially to promote the subsequent metallization (by the silver) and to increase the thickness and adhesion of the silver metal layer formed (in the cavities). For a detailed description of these sensitizing and activation steps, reference may for example be made to patent application US 2001/033935.

More precisely, the silvering operation may be carried out by submerging the substrate comprising the light extraction layer and the partially structured layer, and the through-aperture-containing mask (preferably photoresist) into troughs, each containing one of the following three solutions in this order:
a first (sensitizing) aqueous solution of $SnCl_2$, preferably stirred (preferably for less than 5 minutes, for example 1 min), followed by rinsing in (distilled) water;
a second (activating) aqueous solution of $PdCl_2$, preferably stirred (preferably for less than 5 minutes, for example 1 min), followed by rinsing in (distilled) water; and
a third solution that is a mixture of the silver salt, preferably sliver nitrate, solution and the sliver reducing agent, preferably sodium gluconate, solution, preferably stirred (preferably for less than 15 minutes and even 5 minutes, for example 1 min), followed by rinsing in (distilled) water.

The thus silvered and coated substrate is then removed from the last bath and rinsed in (distilled) water.

Another embodiment consists in spraying the three preceding solutions in the same order as above, rather than submerging the substrate comprising the light extraction layer and the partially structured layer, and the through-aperture-containing mask, which is preferably (photo)resist.

When the grid is obtained using two separate deposition processes to deposit one and the same metal, such as preferably silver (sputtering and silvering, silvering and electroplating, sputtering and electroplating) the properties of the layers of silver may differ, and they may especially have a discernible interface.

Preferably, the second deposition operation is carried out before the mask is removed, the mask therefore being kept.

The high surface and the grid may be polished before or after the electrically conductive coating has been deposited.

The process may furthermore comprise, after the (resist, in particular photoresist) mask—generally covered by the one or more grid materials—has been removed, a step of depositing, directly on the grid and (directly) on the partially structured layer, the monolayer or multilayer electrically conductive coating:
by physical vapour deposition, especially by sputtering, with an optional first deposition of SnZnO or AZO and a second or last or only deposition of ITO, even of $MoO_3$, $WO_3$ or $V_2O_5$; and/or
by wet processing, for example deposition of a conductive polymer, preferably a single deposition of a monolayer electrically conductive coating.

It may be preferable for all of the deposition operations to be wet deposition operations.

The process may comprise, before deposition of the electrically conductive coating, a step of heating the electrode to a temperature above 180° C., preferably comprised between 250° C. and 450° C. and in particular between 250° C. and 350° C., for a length of time preferably comprised between 5 minutes and 120 minutes and in particular between 15 and 90 minutes.

And/or, the process may comprise a heating step after deposition of an electrically conductive coating consisting of a mineral, preferably ITO, layer, this heating being to a temperature above 180° C., preferably comprised between 250° C. and 450° C. and in particular between 250° C. and 350° C., for a length of time preferably comprised between 5 minutes and 120 minutes and in particular between 15 and 90 minutes.

This heating makes it possible to improve the Rsquare of the grid and/or to lower the absorption of the ITO mineral layer.

The invention will now be described in greater detail using nonlimiting examples and figures.

FIG. 1 is a schematic cross-sectional view of an electrically conductive OLED carrier according to a first embodiment of the invention;

FIG. 1A is a detail view of FIG. 1;

FIG. 1B illustrates a schematic top view of the grid used in the carrier in FIG. 1, and FIG. 1C a variant grid;

FIG. 1D is a detail view of a cross section of a cavity of the partially structured layer in a variant of FIG. 1;

Figure 1E:
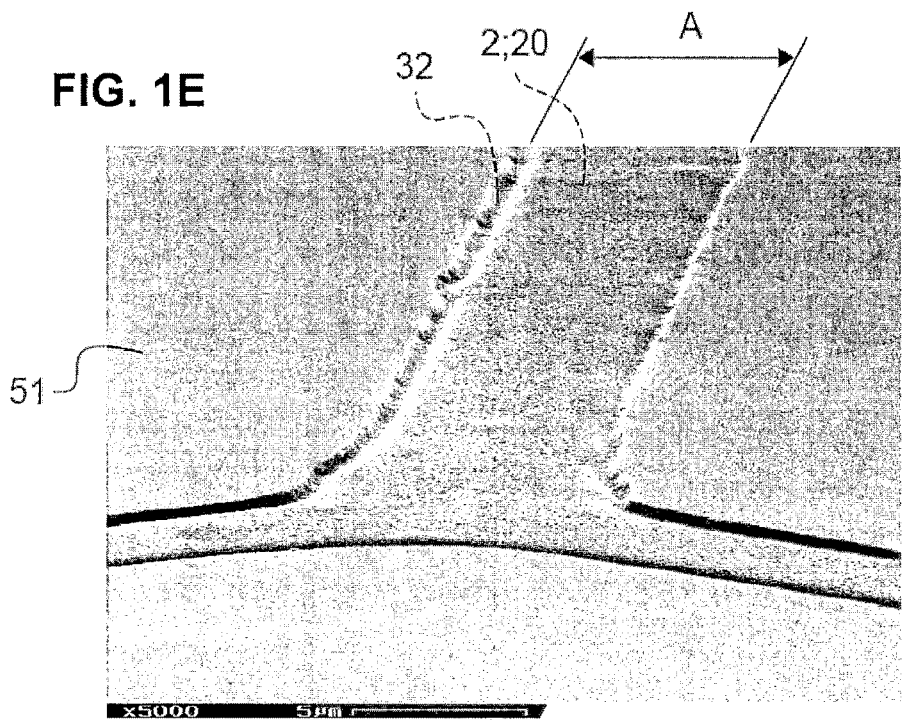
FIGS. 1E to 1H are scanning electron microscope micrographs showing a top view and a detail view of an electrically conductive and scattering OLED carrier in an example (No. 1) according to the invention.
Figure 1F:
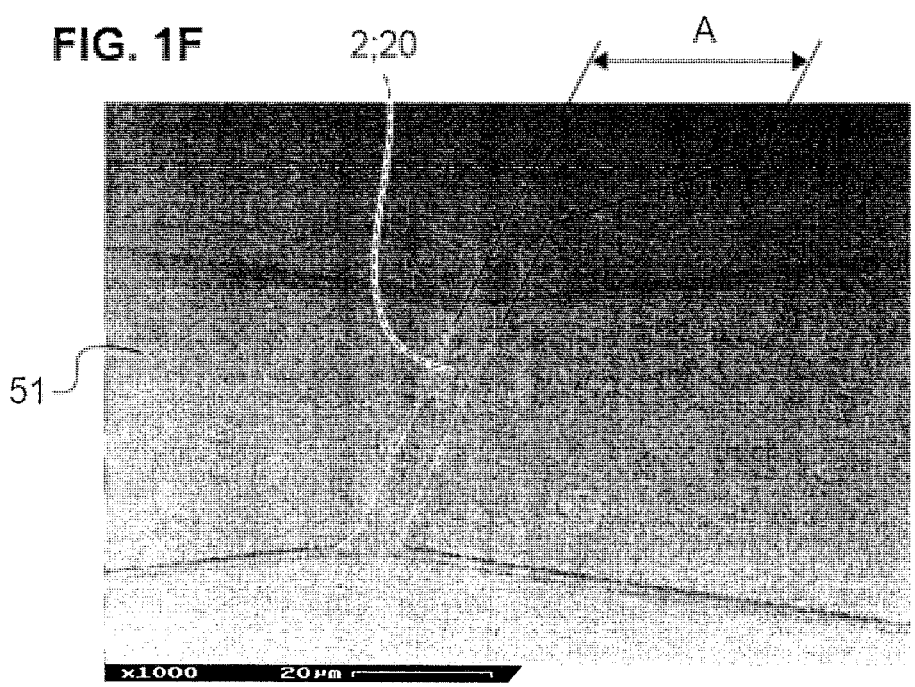

It will be noted that for the sake of clarity the various elements of the objects shown are not to scale.

FIG. 1, which is deliberately very schematic, shows a cross section through an electrically conductive and scattering carrier 100 for a bottom-emitting organic light-emitting device (OLED).

This carrier 100 comprises a flat or curved glazing substrate 1 made of mineral or organic glass having a refractive index $n_s$ of 1.3 to 1.6—that is flat or even textured in order to scatter light—having a first main face 11, called the first surface, bearing, in this order with distance from the substrate:

- an optional alkali-metal barrier layer (not shown) if mineral glass is used, or a moisture barrier layer if organic glass is used, such as silicon nitride or $Ti(Zr)O_2$;
- an electrically insulating preferably mineral light extraction layer 41 formed by an additional scattering layer containing scattering elements 4' (particles etc.), which layer is especially made of high-index vitreous materials of refractive index $n_4$ from 1.7 to 2.3, preferably from 1.80 to 2.10 and in particular from 1.85 to 2.00, these vitreous materials containing scattering elements, namely scattering particles 4' and optionally pores 4", which layer is preferably of a given micron-sized thickness $e_4$;
- a high-index electrically insulating partially structured layer 3 of refractive index $n_3$ from 1.7 to 2.3, preferably from 1.80 to 2.10, and in particular from 1.85 to 2.00, preferably made of a high-index vitreous material (better still of an enamel), of preferably micron-sized thickness $e_3$, scattering particles not being added to the high-index material, this layer 3 covering the surface of the additional scattering layer and containing:
  - a (continuous, non-textured) region called the low region 30, which here is located directly on the additional scattering layer, of given preferably micron-sized thickness e'3, this region 30 covering the surface of the additional scattering layer; and
  - a structured region 31 structured with protrusions and recesses, the protrusions defining a flat high surface 31', and the cavities or recesses being bounded by a bottom 32' (defining a low surface) and flanks 32, the cavities preferably having a height $e_c$ of at most 1500 nm and a given uniform or nonuniform (one-dimensional or two-dimensional, especially meshed) arrangement, the high surface being flat locally;
- an electrode 2, comprising a layer arranged in a grid 20, called the metal grid, which grid is made of metal(s), preferably silver, the grid here being a monolayer formed from strands—in other words tracks—20 anchored in (all) the cavities, the strands having a width A smaller than 50 µm, better still smaller than or equal to 30 µm (and at least 1 µm) and being spaced apart by a distance B smaller than or equal to 5000 µm, which grid has a thickness e2 of at least 100 nm and preferably smaller than 1500 nm, the grid having a sheet resistance smaller than 20Ω/□, and even smaller than 10Ω/□, or 5 Ω/□; and
- an electrically conductive coating 5, here a monolayer, of thickness $e_5$ smaller than or equal to 500 nm, of resistivity $\rho_5$ smaller than 20 Ω·cm and higher than the resistivity of the metal grid, and of given refractive index $n_5$ of at least 1.55, consisting of a mineral layer 51 made of a transparent conductive oxide located on top of the grid and high surface.

To characterize the cavities, as shown in FIG. 1A (detail view of FIG. 1), $A_c$ is defined as the width at the bottom of the cavity, and $B_c$ is defined as the distance between two neighbouring cavity bottoms. $e_c$ is the central height measured from the centre of the bottom of the cavity.

The separation H between the high surface 32 and the surface of the metal grid 2 (at the centre of the cavity) is, in absolute value, smaller than or equal to 100 nm, better still than 30 nm. The grid may extend beyond the high surface or be recessed (as illustrated in FIG. 1A or 1D).

The partially structured layer 3 is preferably flat locally and contains no scattering particles. The partially structured layer preferably contains no pores, at least no or few pores that open onto the surface, at the very least no pores liable to scatter light and/or create locally too great a surface roughness.

To manufacture an OLED device, a single- or multiple- (tandem etc.) junction organic light-emitting system and a reflective (or semi-reflective) especially metal, especially silver- or aluminium-based, upper electrode, are then added.

FIG. 1B is a schematic top view of the grid used in the carrier 100 in FIG. 1. The grid is formed of separate linear strands 20 (therefore in separate cavities forming linear troughs) of width A level with the high surface and of distance B level with the high surface. The inter-pattern distance B corresponds to the maximum distance between neighbouring strands.

FIG. 1C is a grid variant with interconnected strands 20 forming closed meshes or patterns that are for example honeycomb-shaped or of any other geometric (square, etc.) or non-geometric shape, the strands 20 therefore being located in interconnected cavities forming closed meshes or patterns that are for example honeycomb-shaped or of any other geometric or non-geometric shape. The inter-pattern distance B corresponds to the maximum distance between two points of a mesh.

The cavities may have oblique flanks, for example because of the process for etching a layer used to form the partially structured layer.

FIG. 1D illustrates a detail view of a cross section of a cavity of the partially structured layer in a variant of FIG. 1. The flanks flare with distance from the substrate, a horizontal distance L is defined between X and Y such that L≤1.4$e_c$, X being the highest point of the flank and Y being the point at the end of the bottom of the cavity. Moreover, a strand deposited by sputtering is anchored and flush with the high surface. It has cupped lateral zones. The distance H is calculated between the high surface and the grid surface at the centre of the cavity.

In FIGS. 1 and 1A, the cavities have right flanks 32 that are therefore normal to the substrate 1 (therefore L=0).

In a first embodiment (No. 1), with regard to FIG. 1 (and 1A to 1D), the following features were chosen.

The glass was flat, of haze lower than 1%, made of clear soda-lime-silica glass, for example float glass, of index of about 1.5, for example 0.7 mm in thickness, and of $T_L$ of at least 90%.

The additional scattering layer 4, of thickness $e_4$ equal to 10 μm, was a high-index enamel ($n_4$=1.95 at λ=550 nm) composed of a glass matrix rich in bismuth (at least 55% by weight for example and preferably less than 85% by weight), of Tg below 500° C., and containing scattering particles of $TiO_2$ (average diameter 400 nm) or as a variant of $SiO_2$ (average diameter 300 nm), with a particle density of about $5\times10^8$ particles/mm³ for the $TiO_2$ particles, and about $2\times10^8$ particles/mm³ for the $SiO_2$ particles.

The partially structured layer 3 deposited directly on the scattering layer 4 was composed of the same bismuth-rich matrix ($n_3$=1.95 at λ=550 nm) without addition of scattering particles, of thickness $e_3$ of 9 to 12 μm, for example 10 μm. The thickness $e_c$ was 400 nm. The cavities of the enamel layer were obtained by acid etching as detailed above.

The partially structured layer 3 was flat locally. The roughness of the high surface 31 was defined by an Ra lower than 1 nm.

The bake above Tg (and even that for removing the organic medium) was for example carried out once after the paste based on the glass frit and scattering particles had been deposited (and after an optional drying operation) and after the same glass frit paste without scattering particles had been deposited.

The $T_L$ of the glass/scattering layer/partially structured layer assembly was 57%, the haze 85%, and the absorption less than 2%.

The grid 2 was a sliver monolayer (possibly oxidized on its surface) deposited by magnetron sputtering under argon at a pressure of $8\times10^{-3}$ mbar using a sliver target, which deposition was directly into the cavities 32'. The silver was entirely in the cavities, with $e_2$ equal to 350 nm. H was therefore smaller than 100 nm. The pattern of the grid was hexagonal. The width A was equal to 6 μm and the maximum distance B to 280 μm. The coverage T was 4.5%.

The electrically conductive coating 5 consisted of a 70 nm-thick layer of indium tin oxide ITO of refractive index of about 2, and of resistivity $\rho_5$ lower than $10^{-1}$ Ω·cm.

The ITO was deposited by magnetron sputtering under a mixture of argon and oxygen $O_2/(Ar+O_2)$ of 1% at a pressure of $2\times10^{-3}$ mbar using a ceramic target made of indium oxide (90% by weight) and tin oxide (10% by weight).

The Rsquare of the assembly after annealing at 600° C. for 20 mins, measured by the conventional 4-point probe method, was 2.6 ohms/square.

FIGS. 1E to 1H are scanning electron micrographs showing a top view and a cross-sectional view of an electrically conductive and scattering OLED carrier of example No. 1 according to the invention.

Figure 1G:
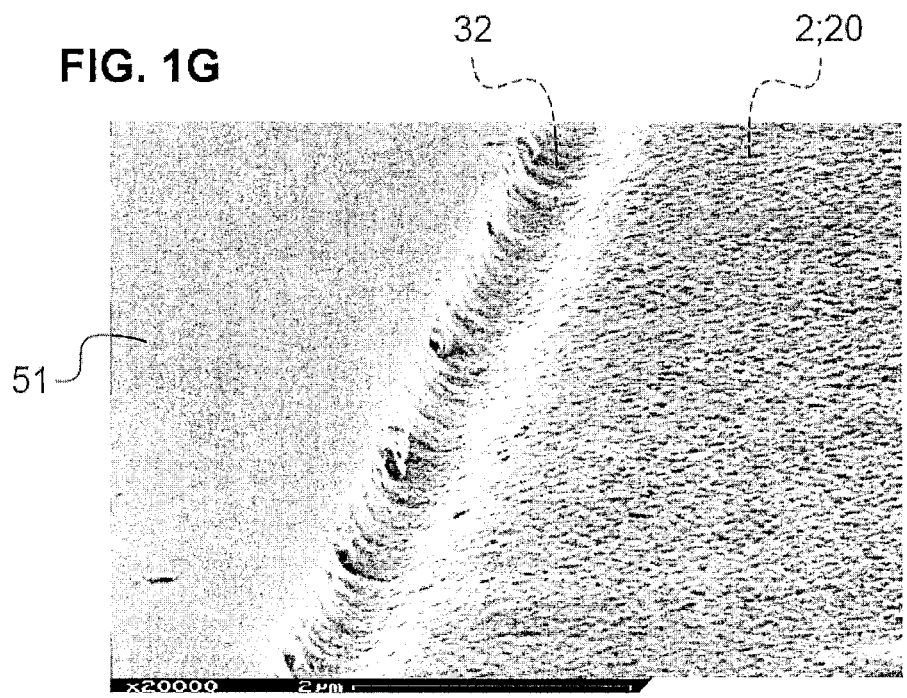

The pattern of the strand 20 of width A under the coating 51 may be seen. In FIG. 1G, the nonuniform distribution of the sliver in the cavity (analogous to the schematic in FIG. 1D) may be seen.

Figure 1H:
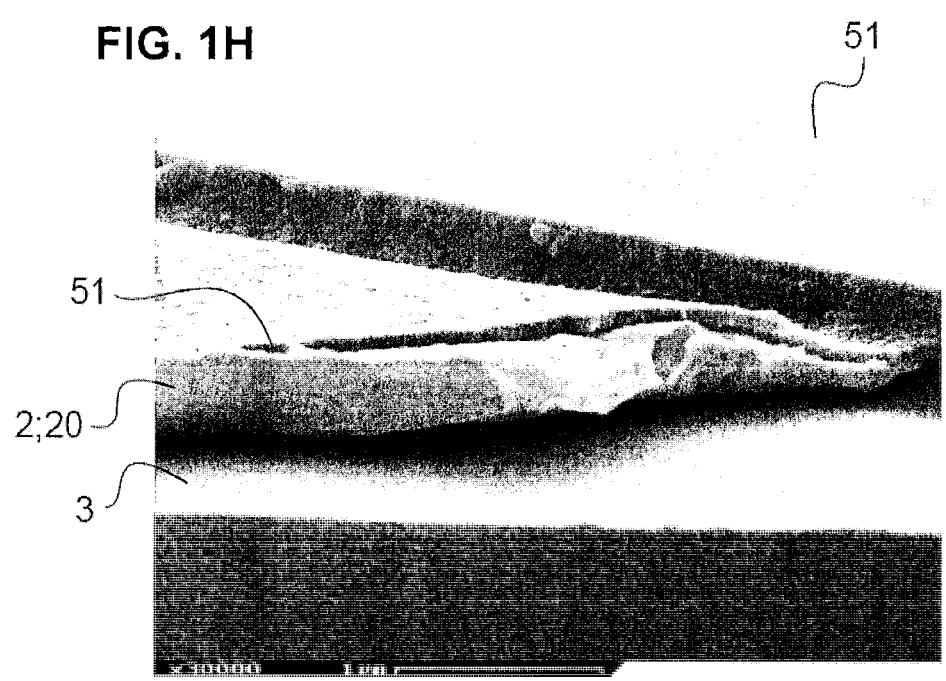

In FIG. 1H, the edge face of the layer 51 and of the strand 2,20 and the surface of the bottom of the cavity and therefore the low surface of the partially structured layer 3 may be seen.

As a variant, provision may be made for the grid to be a multilayer, for example a bilayer, with an overlayer protecting against corrosion (water and/or air), which overlayer is for example made of a metal other than silver, of titanium or nickel, chromium or molybdenum, for example, and is smaller than 1 nm in thickness and even than 3 nm in thickness. The overlayer is deposited by vacuum deposition, preferably in the same deposition tool.

Figure 1I:
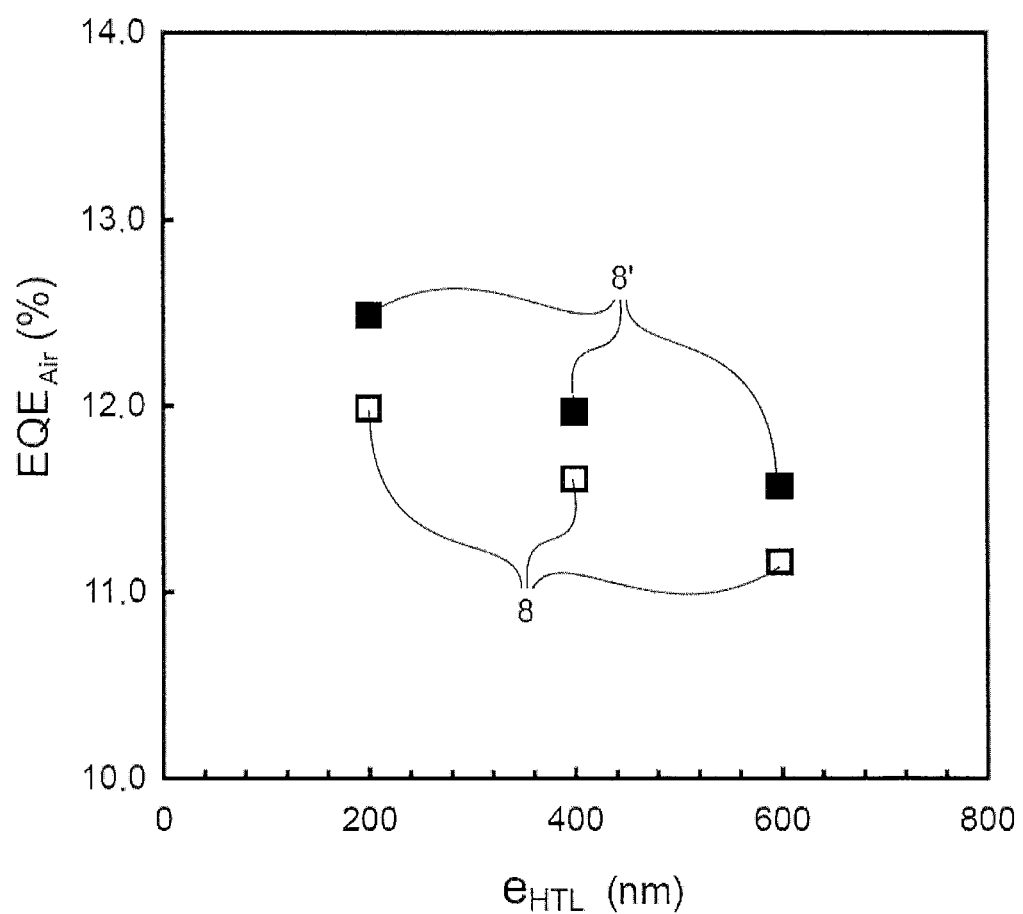
FIG. 1I shows the external quantum efficiency of an OLED made with example No. 1 and of a comparative OLED, as a function of HTL thickness.

FIG. 1I shows the external quantum efficiency measured in air $EQE_{air}$ as a function of the thickness of the HTL of an OLED made with example No. 1 (curve 8) and a comparative OLED (curve 8').

The comparative OLED was produced by the Applicant using the same glass and the same additional scattering layer, the latter being surmounted by an unstructured layer of identical thickness and of identical material as the partially structured layer and having, as an electrode, an ITO layer identical to that of the coating 5 and of thickness equal to 100 nm and of Rsquare of 50 ohm/square—which Rsquare value is therefore much higher.

The light-emitting system comprises:
an HTL of variable thickness (between about 200 and 600 nm);
a 10 nm-thick electron blocking layer (EBL);
a 10 nm-thick layer emitting in the orange;
a 25 nm-thick layer emitting in the blue;
a 10 nm-thick hole blocking layer (HBL); and
a 40 nm-thick electron transport layer (ETL).
The cathode was a 100 nm-thick aluminium layer.

The $EQE_{air}$ was measured inside an integrating sphere. The $EQE_{air}$ of the OLED according to the invention was satisfactory (between 11% and 12%), and was almost equal to that of the comparative OLED. The difference of about 3 to 5% was due to the obstruction of the surface by the silver grid. The efficiency of this OLED was much higher than that of an OLED produced using glass and an electrode based on ITO, the $EQE_{air}$ of which is about 7.5 to 8%.

In a second embodiment (No. 2), again with regard to FIG. 1 (and 1Aa to 1C), the deposition of the silver by sputtering was replaced with a deposition by silvering and the size (height) of the cavities was equal to about 180 nm. The width A remained equal to 6 µm and B to 280 µm. The Rsquare was 3.5 ohm/square. The coverage T was 4%.

The silver layer was deposited in the partially structured layer 3 using the following operating mode for a thickness e2 of about 200 nm:
  the following silvering solutions were diluted (solutions to be diluted provided by the company DR.-ING. SCHMITT, GMBH Dieselstr. 16, 64807 Dieburg/GERMANY):
    100 µl of Miraflex® 1200 (solution of $SnCl_2$) in a 250 $cm^3$ flask (sol No. 1);
    200 µl of Miraflex® PD (solution of $PdCl_2$) in a 250 $cm^3$ flask (sol No. 2);
    15 ml of Miraflex® RV (solution of the reducing agent sodium gluconate) in a 250 $cm^3$ flask (sol No. 3); and
    15 ml of Miraflex® S (silver nitrate solution) in a 250 $cm^3$ flask (sol No. 4);
  the substrate (with the enamel layers 4, 3) was placed in a tray into which the contents of solution No. 1 were poured and stirred for 1 min, before rinsing in distilled water;
  the substrate (with the enamel layers 4, 3) was placed in a second tray into which the contents of solution No. 2 were poured and stirred for 1 min, before rinsing in distilled water;
  the substrate (with the enamel layers 4, 3) was placed in a last tray into which the contents of solutions Nos. 3 and 4 were poured and stirred for 1 min, before rinsing in distilled water; and
  optionally the substrate (with the enamel layers 4, 3) was placed in the first tray (solution No. 1), stirring being carried out for 1 min, before rinsing in distilled water.

Figure 2:
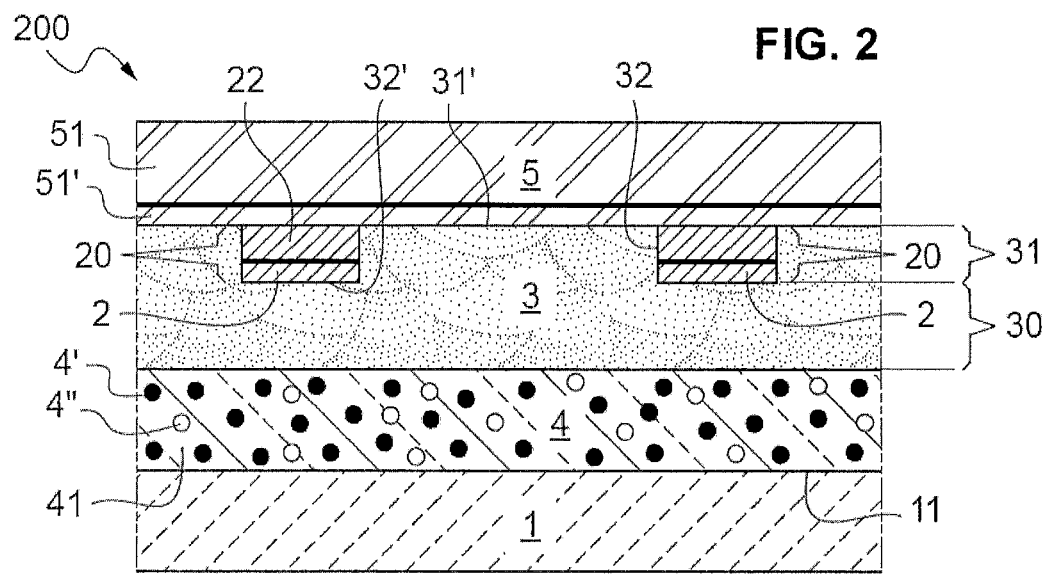
FIG. 2 is a schematic cross-sectional view of an electrically conductive OLED carrier according to a second embodiment of the invention.
Figure 2A:
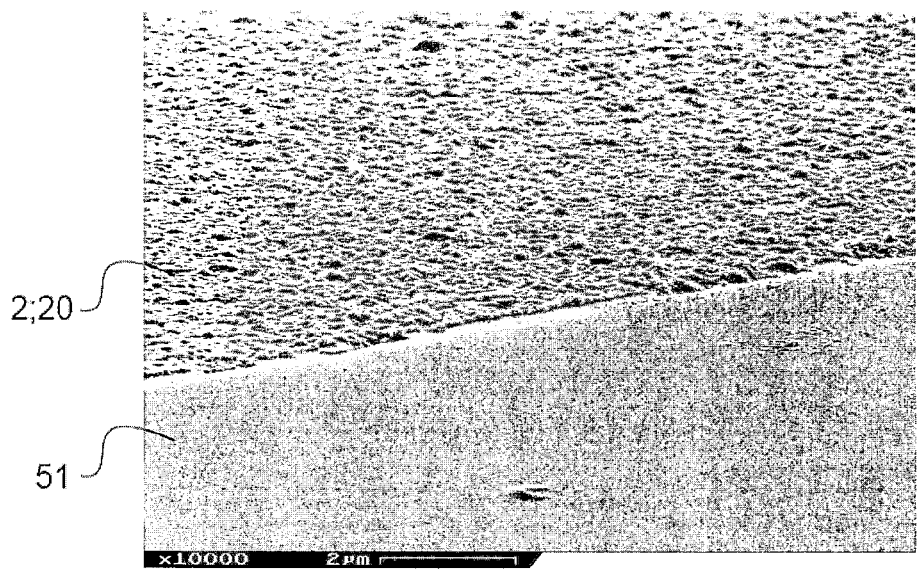
FIGS. 2A, 2B and 6 are scanning electron microscope (SEM) micrographs showing a top view and a detail view of an electrically conductive OLED carrier (without electrically conductive coating) showing the high surface and strands of the grid in an example (No. 2) according to the invention.
Figure 2B:

FIGS. 2A and 2B are scanning electron microscope micrographs showing a top view and a cross-sectional view, respectively, of example No. 2 according to the invention, showing the high surface 31 of the layer 3 and the grid 20 anchored in the layer 3.

FIG. 2, which is intentionally very schematic, shows a cross section through an electrically conductive and scattering carrier 200 for a bottom-emitting organic light-emitting device (OLED) in a second embodiment of the invention in which the silver layer is a bilayer with a first silver layer 21 deposited by silvering (or sputtering) and a thicker second silver layer 22 deposited by electroplating (or silvering).

Moreover, the conductive coating is a bilayer and comprises, under the ITO layer 51, a first layer 51', directly on the metal grid, made of AZO, of thickness e'5 equal to 80 nm, and of refractive index $n'_5$ of about 1.95.

In a third embodiment (No. 3), with regard to FIG. 2, the following features were chosen. Only the modifications relative to the carrier 100 are detailed below.

The first metal layer, i.e. the 80 nm-thick silver tie layer 21, was deposited by silvering.

The first silver layer was deposited in the partially structured layer using the following operating mode for about 80 nm:
  the following silvering solutions were diluted (solutions to be diluted provided by the company DR.-ING. SCHMITT, GMBH Dieselstr. 16, 64807 Dieburg/GERMANY):
    42 µl of Miraflex® 1200 (solution of $SnCl_2$) in a 250 $cm^3$ flask (sol No. 1);
    125 µl of Miraflex® PD (solution of $PdCl_2$) in a 250 $cm^3$ flask (sol No. 2);
    6 ml of Miraflex® RV (solution of the reducing agent sodium gluconate) in a 250 $cm^3$ flask (sol No. 3); and
    6 ml of Miraflex® S (silver nitrate solution) in a 250 $cm^3$ flask (sol No. 4);
  a glass substrate was placed in a tray into which the contents of solution No. 1 were poured;
  the solution was stirred for 1 min, before the substrate was rinsed in distilled water;
  the glazing substrate was placed in a second tray into which the contents of solution No. 2 were poured;
  the solution was stirred for 1 min, before the substrate was rinsed in distilled water;
  the glazing substrate was placed in a last tray into which (after a stopwatch had been started) the contents of solutions Nos. 3 and 4 were poured;
  the solution was stirred for 30 s, before the substrate was rinsed in distilled water;
  optionally the glazing substrate was placed in the first tray, stirring being carried out for 1 min; and
  optionally, the substrate was rinsed in distilled water.

The 350 nm-thick silver second metal layer 22 was deposited by electroplating.

The electrolysis solution (bath) consisted of an aqueous solution of 300 to 500 g/l of sodium thiosulfate ($Na_2S_2O_3$) and of 30 to 50 g/l of sodium metabisulfate ($Na_2S_2O_5$),to which caustic soda (NaOH) tablets were added to adjust the pH to between 8 and 10. Silver chloride (30 g/l AgCl) was added at the moment when the electrochemistry was to be started.

The AZO layer was deposited by magnetron sputtering using a ceramic target of zinc oxide (98% by weight) and of alumina (2% by weight) at a pressure of $2 \times 10^{-3}$ mbar in a mixture of argon and oxygen such that $O_2/(Ar+O_2)=1.6\%$.

Figure 3:
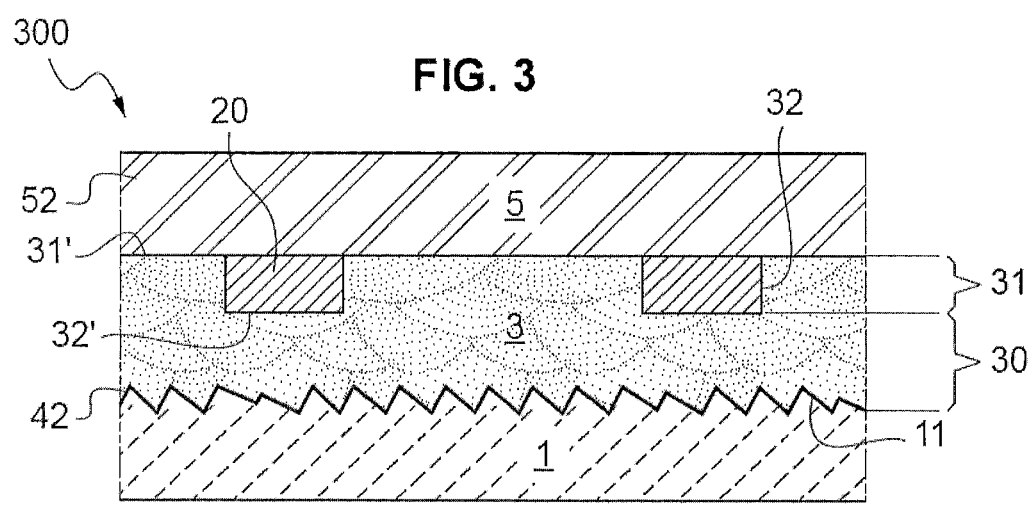
FIG. 3 is a schematic cross-sectional view of an electrically conductive OLED carrier according to a third embodiment of the invention.

FIG. 3, which is intentionally very schematic, shows a cross section through an electrically conductive and scattering carrier 300 for a bottom-emitting organic light-emitting device (OLED) in a fourth embodiment of the invention.

Only modifications relative to the carrier 100 are detailed below.

The light extraction layer 42 is formed by the first surface of the glass, which surface is a rough, scattering surface. Thus, the partially structured layer 3 is located directly on the scattering first surface of the glass.

Moreover, the electrically conductive coating is a high-index conductive polymer 52.

In a fourth embodiment (No. 4), with regard to FIG. 3, the following features were chosen.

The first surface 42 was a scattering surface. The roughness of the first surface 11 was obtained by etching the glass, for example using hydrofluoric acid. An example of a rough substrate is the glass called Satinovo® Mate produced by the Saint-Gobain company La Veneciana. The protrusions of the etched substrate are for example substantially pyramid-shaped and randomly distributed, scattering light isotropically.

The following table gives the roughness parameters Ra, Rz and the haze.

| Ra (μm) | Rz (μm) | Haze % |
|---------|---------|--------|
| 2.40    | 16.9    | 88.0   |

For the partially structured layer 3 the enamel chosen was such as described for the layer of example 1, of thickness $e_3$ of 20 μm.

The electrically conductive coating 52, made of PEDOT/PSS, was deposited by wet processing and had a resistivity ρ1 of about $10^{-1}$ ohm·cm, for example, and a thickness of about 100 nm or more.

FIGS. 4A to 4G are schematic views of the process for manufacturing the partially structured layer by photolithography and by acid etching, and for manufacturing the grid, as shown in FIG. 1.

Figure 4A:
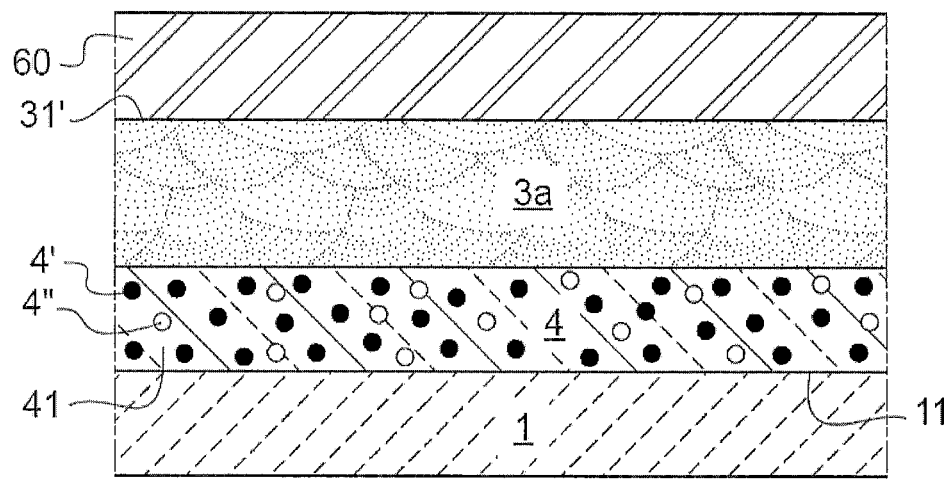
FIGS. 4A to 4G are schematic views of the process for manufacturing the electrically conductive carrier in FIG. 1.

The first step illustrated in FIG. 4A consists, starting with glass 1 coated with the light extraction layer 4 formed by the additional scattering layer on the substrate, which layer is made of a mineral material containing scattering particles:

in forming, on the light extraction layer, a high-index layer 3a that comprises the vitreous material (preferably an enamel) with said refractive index $n_3$; and in applying a layer 60 of a liquid masking material, here a positive photoresist, conventional AZ1505 resist, to the layer 3a.

The resist is then baked at 100° C. for twenty minutes in a convection oven. The thickness of the mask is 800 nm.

Figure 4B:
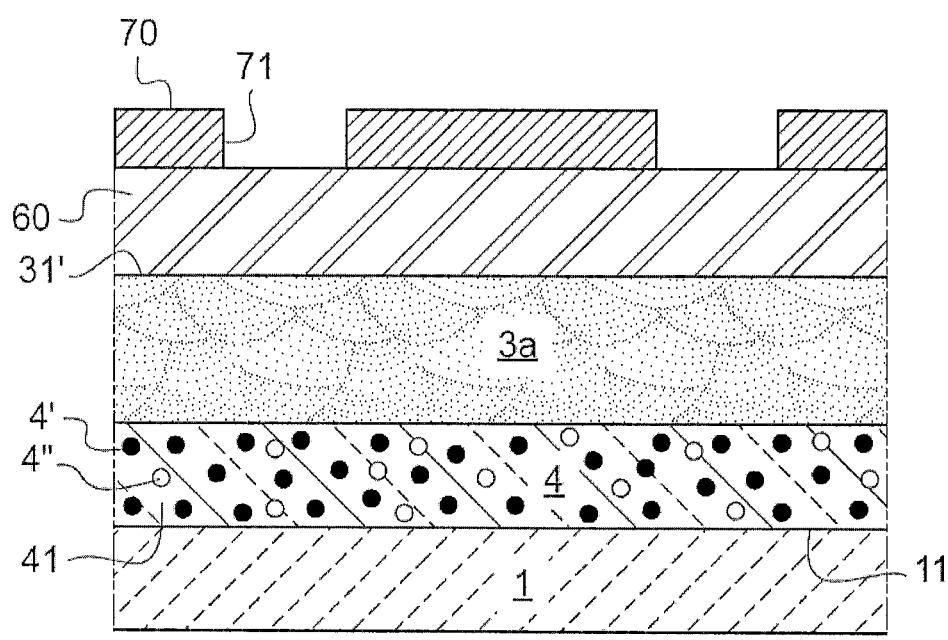

The second step illustrated in FIG. 4B consists in generating the photoresist pattern. To do this, a photolithography mask 70 containing discontinuities 71 is applied to the resist 60 and the resist 60 is irradiated with UV (10 seconds of about 50 W/cm²) through the discontinuities, in the zones intended to become the through-apertures, the discontinuities having a nonuniform or uniform, one-dimensional (FIG. 1C) or two-dimensional (FIG. 1D) arrangement.

Figure 4C:
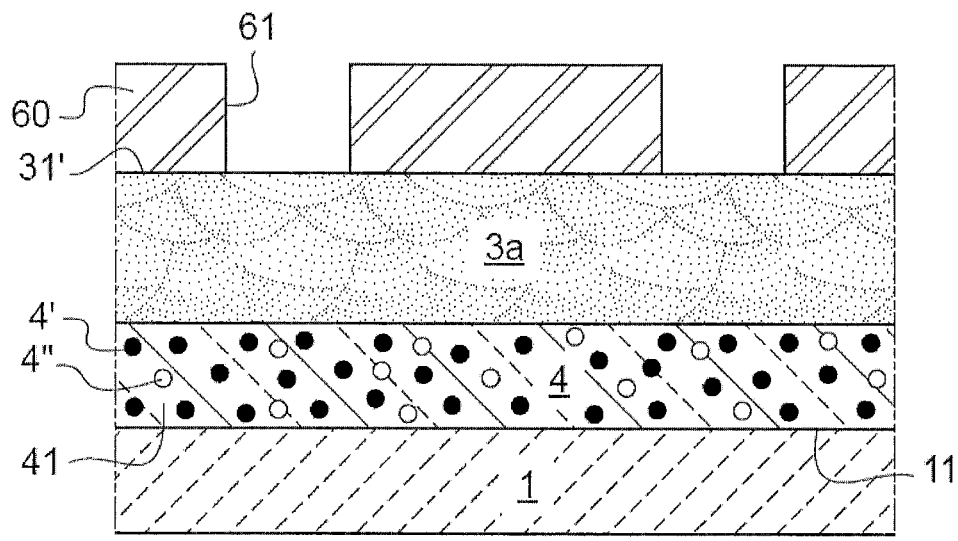
Figure 4D:
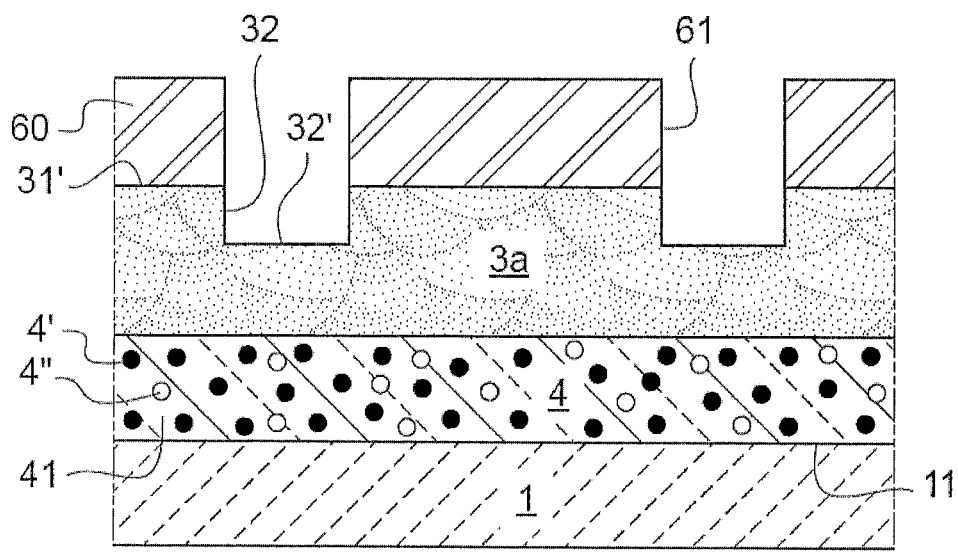

The third step illustrated in FIG. 4C consists in creating through-apertures in the photoresist 60. The irradiated zones are removed by dissolving in a specific conventional solution (here a metal-iron free (MIF) developer) for 50 seconds, and rinsed in deionized water, thus forming through-apertures 61 through the photoresist.

Alternatively, a negative photoresist and an inverted photolithography mask (removal of the non-irradiated zones to form the apertures) may be used.

The fourth step illustrated in FIG. 4C consists in creating cavities in the continuous layer 3a. The partially structured layer is preferably formed by wet etching rather than dry etching, for example by acid etching at room temperature. The resist chosen is therefore resistant to the etching solution, which is acetic acid of pH 2.1. The etch depth is then controlled by the length of the etch, here at 35 nm·min$^{-1}$.

The etch forms cavities of depth $e_c$ with flanks 32 that may be oblique and curved, extending a horizontal distance $L<1.4\ e_c$.

Figure 4E:
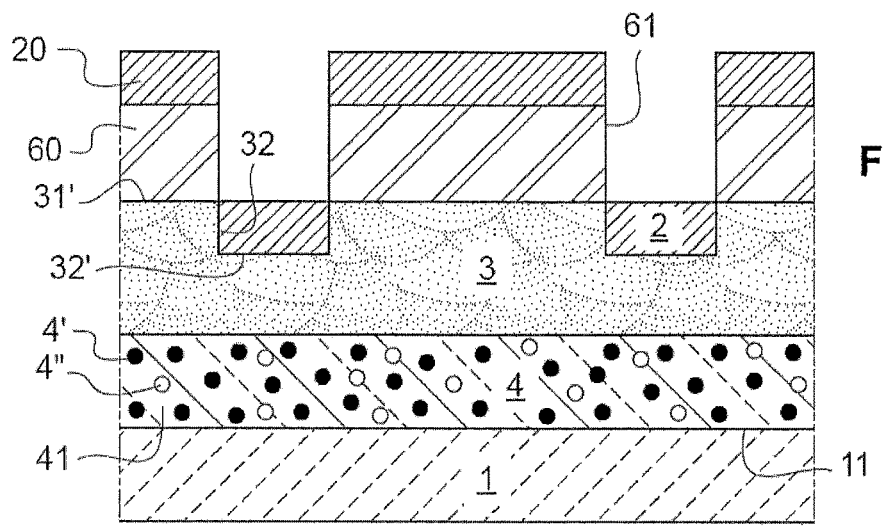

The fifth step illustrated in FIG. 4E consists in depositing the grid material 2, preferably silver deposited by vacuum deposition, by magnetron sputtering, or as a variant by a wet process such as silvering. The deposition is carried out through the apertures 61 in the photoresist 60 (etch mask), into the cavities in order to fill them at least partially. Silver is also deposited on the surface of the mask (and is absent from the high surface of the layer 3).

Figure 4F:
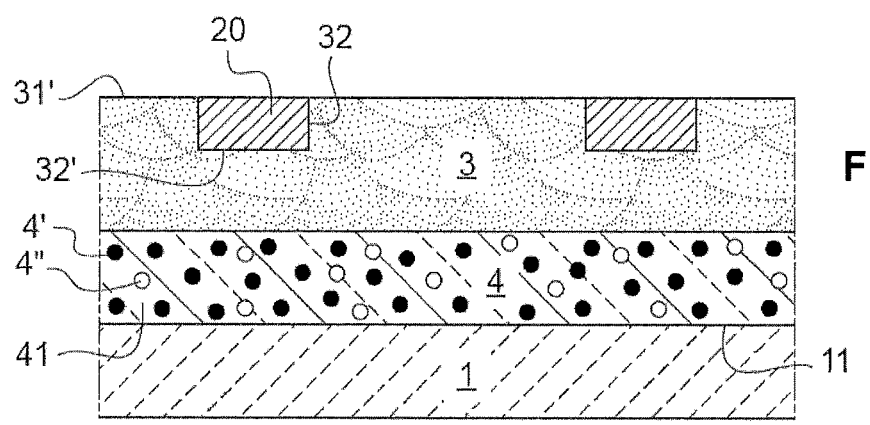

The sixth step illustrated in FIG. 4F consists in removing the mask, for example using a wet process (acetone solvent and ultrasound).

Figure 4G:
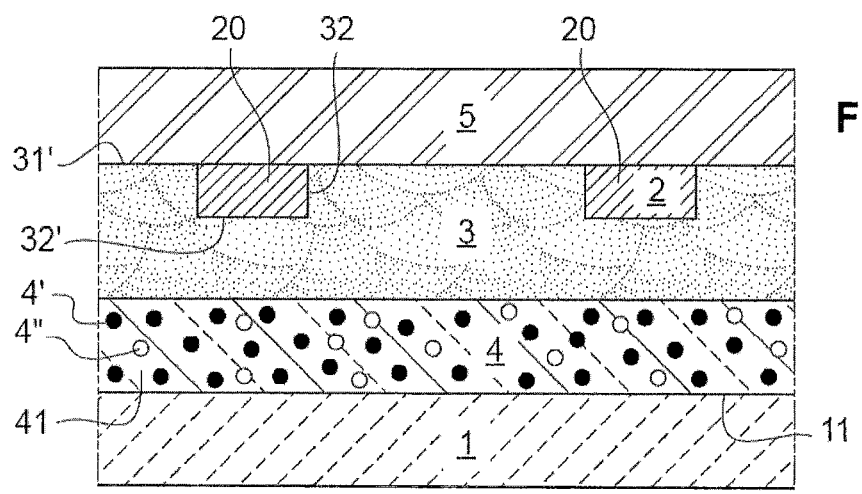

The seventh step illustrated in FIG. 4G consists in depositing the electrically conductive coating 5.

FIGS. 4H to 4N are schematic views of a variant of the process for manufacturing the partially structured layer by photolithography and by acid etching, and for manufacturing the grid, as shown in FIG. 1.

Figure 4H:
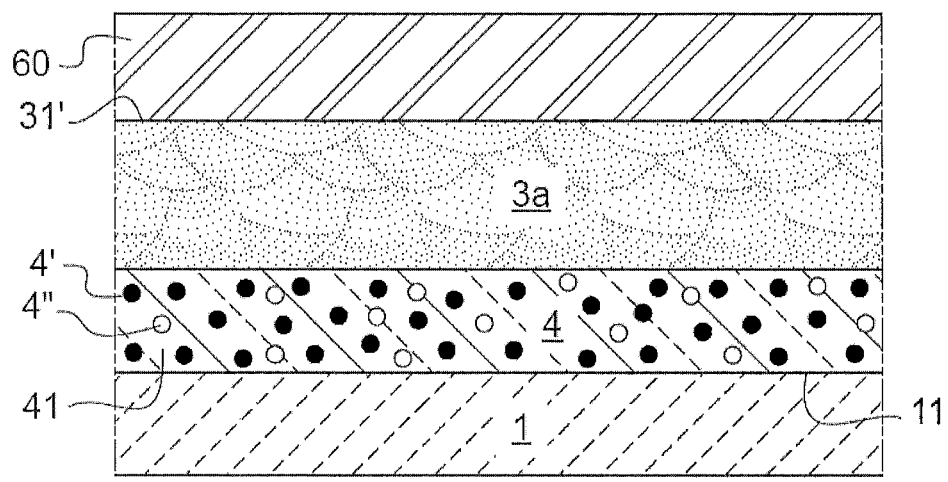
FIGS. 4H to 4N are schematic views of a process for manufacturing the electrically conductive carrier in FIG. 1, in a variant.

The first step illustrated in FIG. 4H consists, starting with glass 1 coated with the light extraction layer 4 formed by the additional scattering layer on the substrate, which layer is made of a mineral material containing scattering particles:

in forming, on the light extraction layer, a high-index layer 3a that comprises the vitreous material (preferably an enamel) with said refractive index $n_3$; and in applying a layer 60 of a liquid masking material, here a positive photoresist, conventional AZ1505 resist, to the layer 3a.

The resist is then baked at 100° C. for twenty minutes in a convection oven. The thickness of the mask is 800 nm.

Figure 4I:
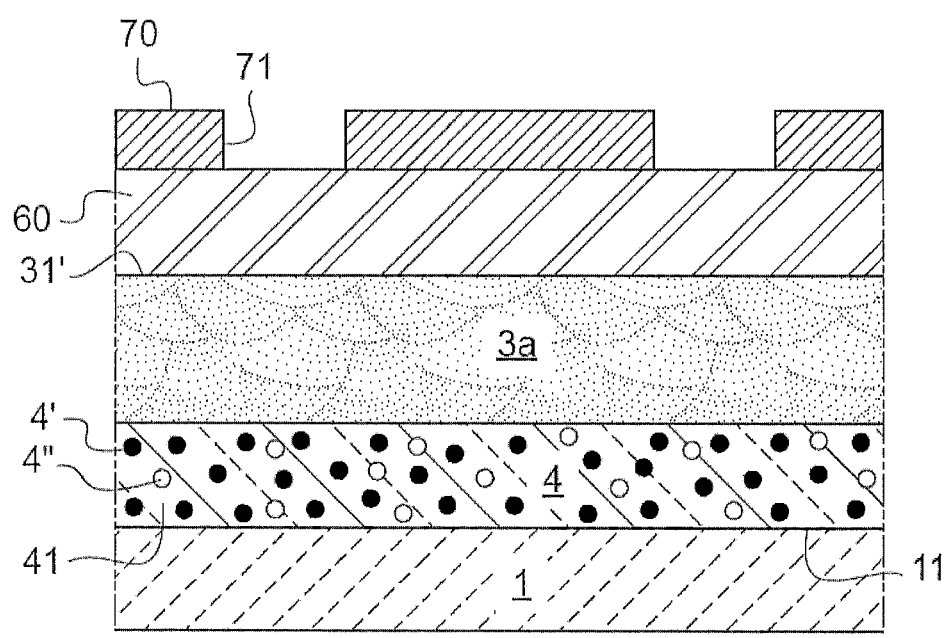

The second step illustrated in FIG. 4I consists in generating the photoresist pattern. To do this, a photolithography mask 70 containing discontinuities 71 is applied to the resist 60 and the resist 60 is irradiated with UV (10 seconds of about 50 W/cm²) through the discontinuities, in the zones intended to become the through-apertures, the discontinuities having a nonuniform or uniform, one-dimensional or two-dimensional arrangement.

Figure 4J:
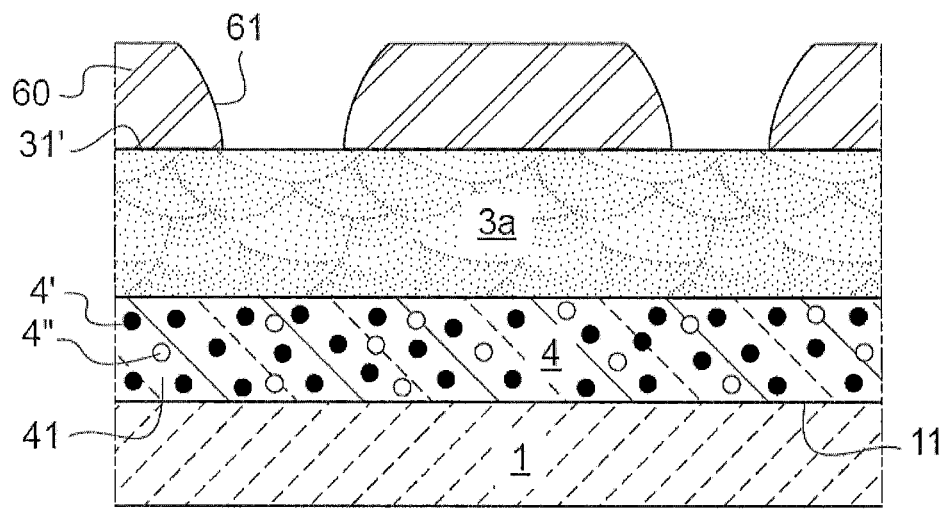

The third step illustrated in FIG. 4J consists in creating through-apertures in the photoresist. The irradiated zones are removed by dissolving in a specific conventional solution (here a metal-iron free (MIF) developer) for 50 seconds, and rinsed in deionized water, thus forming through-apertures 61 through the photoresist.

The flanks of the photoresist may be right and perpendicular to the glass 1 or as shown here oblique and flaring with distance from the glass.

Alternatively, a negative photoresist and an inverted photolithography mask (removal of the non-irradiated zones to form the apertures) may be used.

Figure 4K:
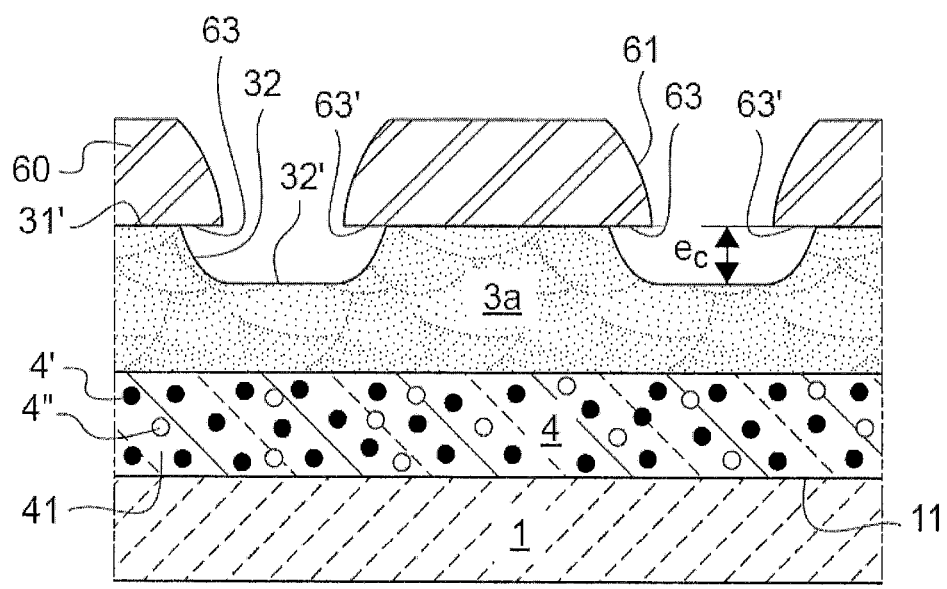

The fourth step illustrated in FIG. 4K consists in creating cavities in the continuous layer 3a. The partially structured layer is preferably formed by wet etching rather than dry etching, for example by acid etching at room temperature. The resist chosen is therefore resistant to the etching solution, which is acetic acid of pH 2.1. The etch depth is then controlled by the length of the etch, here at 35 nm·min$^{-1}$.

The etch forms cavities of depth $e_c$ with flanks 32 that may be oblique and curved. The etching is isotropic i.e. the etching solution, here an acid, attacks (etches) in al directions.

The etching profile is cup-shaped. The cavities are of width W larger than the width W0 of the through-apertures in the mask in the plane of the interface between the mask and the high-index layer, causing portions 63, 63' of surfaces of the mask of positive photoresist facing the cavity to jut beyond the high surface.

Figure 5A:
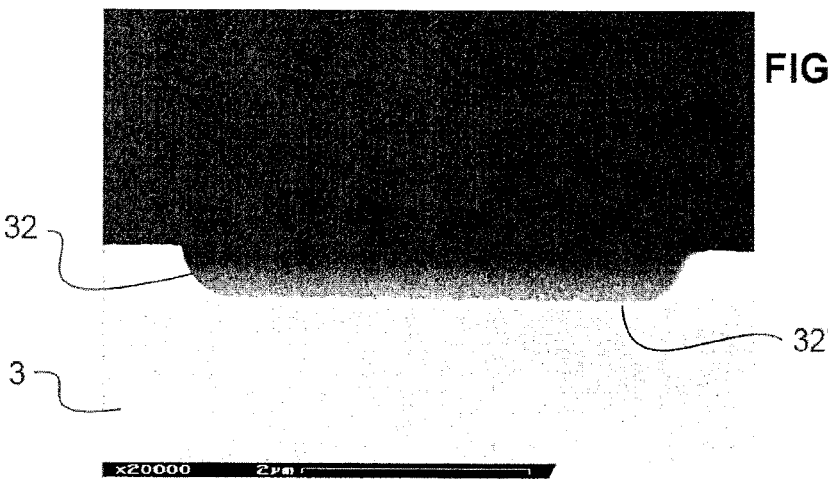
FIGS. 5a to 5b are scanning electron microscope micrographs showing a partially structured layer with a cavity.
Figure 5B:
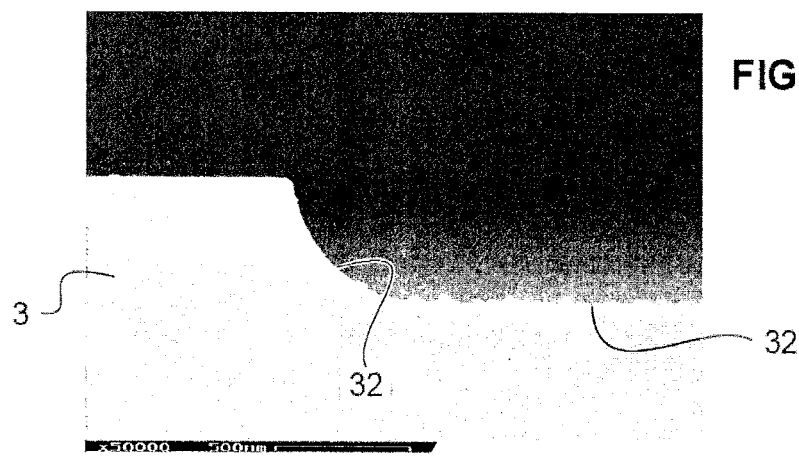

The oblique flanks 32 each extend a horizontal distance $L<1.4\ e_c$ such as shown in FIGS. 5A to 5B. The bottom 32' is flat.

Figure 4L:
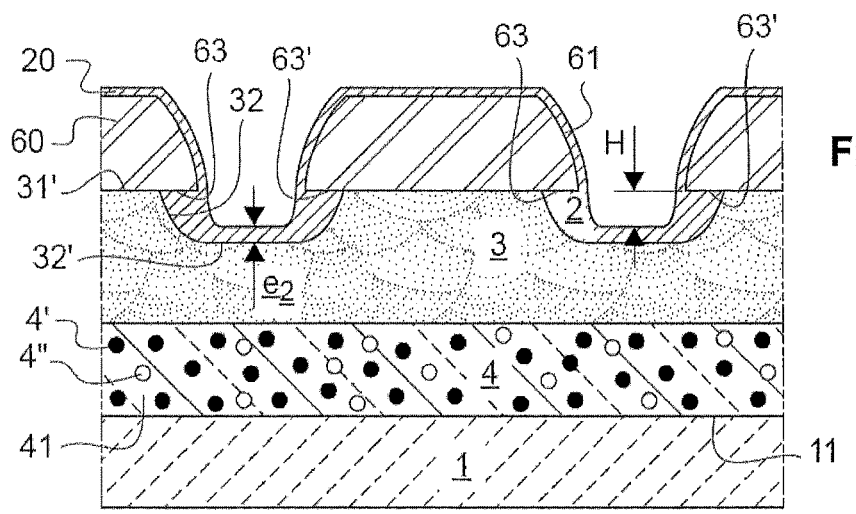

The fifth step illustrated in FIG. 4L consists in depositing the grid material 2 by slivering. The deposition is carried out through the apertures 61 in the photoresist 60 (acid etch mask), into the cavities in order to fill them at least partially. Silver is also deposited on the outermost surface of the mask (and is absent from the high surface of the layer 3).

More precisely, the silvering at least partially fills said cavity and the entire height of the flanks of the cavity and the surface portions 63, 63' jutting out facing the cavity. Thus, this forms peripheral lateral strand zones 23, 23' that lie flush with the high surface and that are flat and smoother than the central strand zone 24 facing the aperture.

The maximum width A of the strand is here the width at the surface of the strand. The width L1 of each peripheral lateral zone is approximately equal to L.

FIG. 4L (like the following) is not to scale insofar as e2 is for example generally (much) larger than H.

Example roughness parameters for the strands obtained by silvering, in the central zone set back from the high surface, are collated in the following table.

| Area of the strand | Rq (nm) | Rmax (nm) | e (nm) |
|---|---|---|---|
| Flat lateral zones | 1.5 | 8 | 200 |
| Central zones | 20 | 200 | 200 |
| Flat lateral zones | 2 | 10 | 300 |
| Central zones | 30 | 300 | 300 |
| Flat lateral zones | 2 | 10 | 450 |
| Central zones | 35 | 450 | 450 |

Figure 4M:
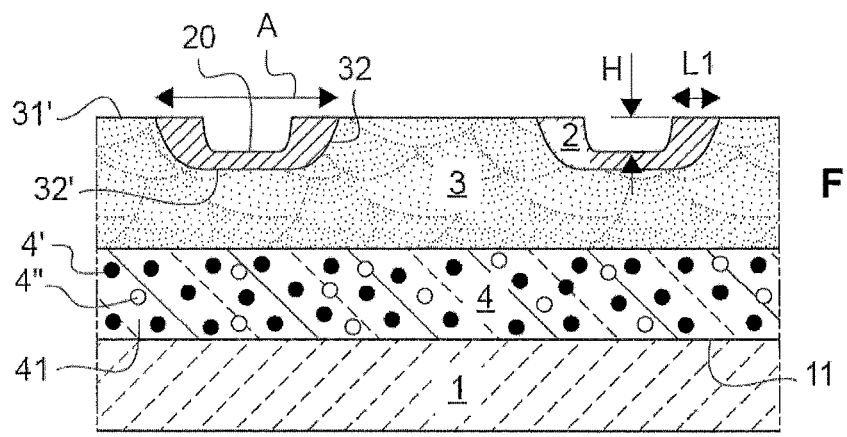

The sixth step illustrated in FIG. 4M consists in removing the mask, preferably using wet processing with acetone solvent and ultrasound.

Figure 4N:
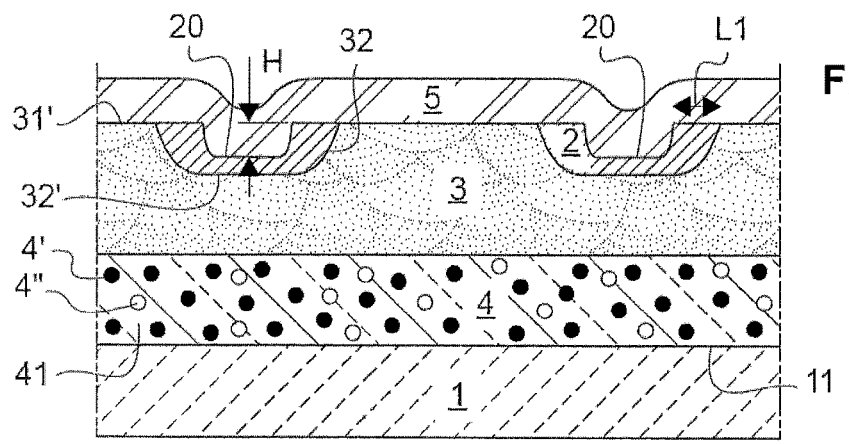

The seventh step illustrated in FIG. 4N consists in depositing the electrically conductive coating 5.

Figure 6:
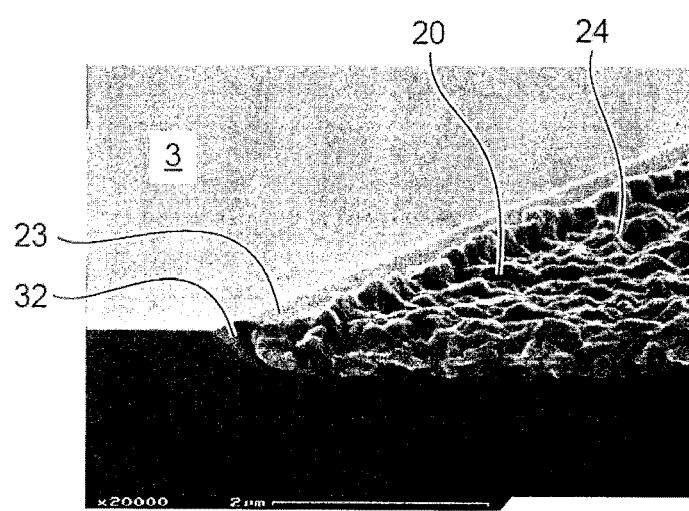

Complementary to FIGS. 2A and 2B, FIG. 6, which is a SEM micrograph, shows an example almost-flush metal grid obtained by silvering, with a strand 20 in an oblique-flanked cavity 32 in the partially structured layer 3. The central zone 24 is rougher than the peripheral lateral zones 23 that are furthermore flush with the high surface.

What is claimed is:

1. An electrically conductive OLED carrier comprising in this order:
    an organic or mineral glass glazing substrate of refractive index $n_1$ of 1.3 to 1.6 having a first surface; and
    an electrode, borne by the glazing substrate on the same side as the first surface, which electrode comprises a layer arranged in a metal grid, which metal grid is made of one or more metals having a sheet resistance smaller than 20Ω/□ and having a thickness e2 of at least 100 nm, the metal grid being formed from strands, the strands having a width smaller than or equal to 50 μm and being separated by an inter-strand distance smaller than or equal to 5000 μm, the strands being separated by a plurality of electrically insulating non-electrically conductive fields of refractive index higher than 1.65,
  wherein, on the same side as the first surface, the carrier comprises:
    an electrically insulating light extraction layer under the metal grid; and
    a layer partially structured in its thickness, the layer being of given composition and of refractive index $n_3$ of 1.7 to 2.3, and being located on the light extraction layer, which partially structured layer is formed:
      from a structured region, located furthest from the light extraction layer, structured with cavities at least partially containing the metal grid, the structured region containing the non-electrically conductive fields; and
      from another region located closest to the light extraction layer under the metal grid,
  wherein a separation between a surface of the non-electrically conductive fields, and a surface of the metal grid is, in absolute value, smaller than or equal to 100 nm, and
  wherein the strands are elongate, the strands having along their length a central zone between peripheral lateral zones, the peripheral lateral zones lying flush with the surface of the non-electrically conductive fields, and wherein a surface roughness of the central zone is higher than the surface roughness in the peripheral zones.

2. The electrically conductive carrier according to claim 1, wherein the structured region does not contain any scattering particles.

3. The electrically conductive carrier according to claim 1, wherein the partially structured layer is electrically insulating.

4. The electrically conductive carrier according to claim 1, wherein the partially structured layer is made of a vitreous material.

5. The electrically conductive carrier according to claim 1, wherein the substrate is made of mineral glass, and the light extraction layer comprises a scattering layer the constituents of which comprise a vitreous material and scattering elements, and the composition of the partially structured layer comprises a vitreous material, and/or wherein a scattering first surface of the substrate forms part or is the light extraction layer, and the composition of the partially structured layer comprises a vitreous material.

6. The electrically conductive carrier according to claim 1, wherein the cavities have a height $e_c$ of at least 50 nm, and wherein the cavities are bounded by flanks that are right or that flare with distance from the substrate by a horizontal distance L such that $L \leq 1.4 e_c$.

7. The electrically conductive carrier according to claim 1, wherein the metal grid is made of silver and obtained by silvering.

8. The electrically conductive carrier according to claim 1, wherein the roughness parameter Rq in the peripheral zones is at most 5 nm and the Rq in the central zone is at least 10 nm.

9. The electrically conductive carrier according claim 8, wherein each peripheral lateral zone is of width L1 larger than or equal to a height $e_c$ of the cavity, with $L1 \leq 1.4 e_c$.

10. The electrically conductive carrier according to claim 1, wherein the metal grid has a central zone that is set back from the surface of the non-electrically conductive fields.

11. The electrically conductive carrier according to claim 1, wherein the metal grid has a coverage T smaller than 25%.

12. The electrically conductive carrier according to claim 1, wherein the thickness e2 is smaller than 1500 nm, and the width is smaller than 30 μm.

13. The electrically conductive carrier according to claim 1, wherein the material or materials of the metal grid are chosen from the group formed by silver, copper, aluminium, gold and alloys based on these metals.

14. The electrically conductive carrier according to claim 1, wherein the metal grid is a multilayer and comprises:

a first metal layer, made of a first metal, forming less than 10% of the total thickness e2 of the metal grid and/or at least 3 nm of the total thickness e2; and a second metal layer based on a second metal, forming at least 80% of the thickness e2 of the metal grid.

15. The electrically conductive carrier according to claim 1, wherein the metal grid is located directly in the cavities or is located on a dielectric tie layer present in the bottom of the cavities, the dielectric tie layer being smaller than 30 nm in thickness.

16. The electrically conductive carrier according to claim 1, wherein an electrically conductive coating covers the surface of the non-electrically conductive fields and the metal grid, the electrically conductive coating having a thickness $e_5$ smaller than or equal to 500 nm, a resistivity $\rho_5$ smaller than 20 $\Omega$·cm and higher than the resistivity of the metal grid, and a refractive index $n_5$ of at least 1.55.

17. The electrically conductive carrier according to claim 16, wherein the electrically conductive coating comprises a mineral layer of refractive index $n_a$ comprised between 1.7 and 2.3, the mineral layer being made of a transparent electrically conductive oxide based on tin oxide and/or zinc oxide and/or indium oxide, which oxide is optionally doped and/or mixed.

18. The electrically conductive carrier according to claim 16, wherein the electrically conductive coating comprises an organic layer of submicron-sized thickness made of one or more conductive polymers of refractive index $n_b$ of at least 1.55.

19. The electrically conductive carrier according to claim 16, wherein the electrically conductive coating is a multilayer and comprises a first layer located directly on the metal grid and covering the non-electrically conductive fields, which first layer is made of a transparent electrically conductive oxide of thickness $e'_5$ smaller than 200 nm and of refractive index $n'_5$ comprised between 1.7 and 2.3.

20. The electrically conductive carrier according to claim 16, comprising an organic light-emitting system deposited on the electrically conductive coating, optionally including a hole transport layer or a hole injection layer.

21. An organic light-emitting device incorporating an electrically conductive carrier according to claim 1.

22. A process for manufacturing the conductive carrier according to claim 1, comprising in this order:
providing the substrate comprising:
the light extraction layer formed by the first surface of the substrate, which is scattering, and/or formed by a scattering layer on the substrate; and
on the light extraction layer, a high-index layer made of the composition of refractive index $n_3$, which layer contains no scattering particles,
forming cavities in the high-index layer, thus forming the partially structured layer, the forming comprising:
producing, on the high-index layer a discontinuous mask containing a given arrangement of through-apertures; and
etching the high-index layer through the through-apertures in the mask, and
forming the metal grid, wherein the forming of the metal grid comprises first depositing a first metal of the grid in the cavities.

23. The process for manufacturing the conductive carrier according to claim 22, wherein the etching is a wet process especially employing an acid solution.

24. The process for manufacturing the conductive carrier according to claim 22, wherein the mask is a resist and wherein the first depositing is a silvering operation.

25. The process for manufacturing the conductive carrier according to claim 22, wherein at least one of said cavities has a width larger than the width of the through-aperture in the mask in a plane of an interface between the mask and the high-index layer, causing portions of surfaces of the mask facing the cavity to just beyond the surface of the non-electrically conductive fields, and wherein the first depositing is a silvering operation that at least partially fills the cavity and the entire height of the flanks of the cavity and all or part of said surface portions, thus forming lateral peripheral strand zones that lie flush with the surface of the non-electrically conductive fields and that are less rough than the central strand zone opposite the aperture.

26. The electrically conductive carrier according to claim 1, wherein the insulating light extraction layer is closer to the substrate than the partially structured layer.

27. The electrically conductive carrier according to claim 1, wherein the surface of at least one of the non-electrically conductive fields that extends from a first of the strands to a second of the strands, which is adjacent to the first of the strands, is planar.

28. The electrically conductive carrier according to claim 1, wherein the partially structured layer is made of an enamel.

* * * * *